US012456432B2

(12) United States Patent
Zhang

(10) Patent No.: US 12,456,432 B2
(45) Date of Patent: *Oct. 28, 2025

(54) DISPLAY PANEL AND DISPLAY DRIVE CIRCUIT

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventor: Mengmeng Zhang, Wuhan (CN)

(73) Assignees: Wuhan Tianma Micro-Electronics Co., Ltd., Wuhan (CN); Wuhan Tianma Micro-Electronics Co., Ltd. Shanghai Branch, Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/637,886

(22) Filed: Apr. 17, 2024

(65) Prior Publication Data

US 2024/0265880 A1 Aug. 8, 2024

Related U.S. Application Data

(63) Continuation of application No. 18/070,631, filed on Nov. 29, 2022, now Pat. No. 11,990,096.

(30) Foreign Application Priority Data

Jun. 30, 2022 (CN) ......................... 202210759084.1

(51) Int. Cl.

| | |
|---|---|
| *G09G 3/3266* | (2016.01) |
| *G09G 3/3275* | (2016.01) |
| *G11C 19/28* | (2006.01) |

(52) U.S. Cl.

CPC ......... *G09G 3/3266* (2013.01); *G09G 3/3275* (2013.01); *G11C 19/287* (2013.01);

(Continued)

(58) Field of Classification Search

CPC ............ C12Q 1/6883; C12Q 2600/156; G09G 2300/0819; G09G 2310/0251;

(Continued)

(56) References Cited

U.S. PATENT DOCUMENTS

| | | | | |
|---|---|---|---|---|
| 11,990,096 | B2 * | 5/2024 | Zhang | G09G 3/3266 |
| 2011/0273417 | A1 | 11/2011 | Shin et al. | |
| 2018/0096644 | A1 | 4/2018 | Jang et al. | |

FOREIGN PATENT DOCUMENTS

| | | |
|---|---|---|
| KR | 1020140098881 A | 8/2014 |
| KR | 101761414 B1 | 7/2017 |

* cited by examiner

*Primary Examiner* — Nitin Patel
*Assistant Examiner* — Amen W Bogale
(74) *Attorney, Agent, or Firm* — Anova Law Group, PLLC

(57) ABSTRACT

A display drive circuit includes first shift registers from a first shift register of a 1st-stage to a first shift register of an Nth-stage; first shift registers of first A stages are virtual shift registers which are at least configured to make that an inputted second signal of a same pixel circuit has a delay of a set time length t relative to the first signal; and first shift registers of last (N-A) stages are at least configured to provide pixel circuits with the second signal; where t=a+b+c+d;

$$A = \frac{t}{t_0 * X}.$$

A particular drive time sequence is formed in the present disclosure, which improves the characteristics of the drive transistor, solve the display problem caused by the tailing (Continued)

problem of the output signal of the first shift register, and improve image display quality.

20 Claims, 18 Drawing Sheets

(52) U.S. Cl.
CPC .............. *G09G 2310/0278* (2013.01); *G09G 2310/0286* (2013.01); *G09G 2310/061* (2013.01); *G09G 2320/0247* (2013.01)

(58) Field of Classification Search
CPC ... G09G 2310/0262; G09G 2310/0278; G09G 2310/0286; G09G 2310/061; G09G 2320/0233; G09G 2320/0238; G09G 2320/0247; G09G 2320/0252; G09G 2320/0257; G09G 2320/045; G09G 3/3233; G09G 3/3266; G09G 3/3275; G09G 3/3291; G11C 19/28; G11C 19/287
See application file for complete search history.

DISPLAY PANEL AND DISPLAY DRIVE CIRCUIT

CROSS-REFERENCE TO RELATED APPLICATION

This application is a continuation of application Ser. No. 18/070,631, filed on Nov. 29, 2022, which claims the priority of Chinese Patent Application No. 202210759084.1, filed on Jun. 30, 2022, the contents of all of which are incorporated herein by reference in their entireties.

TECHNICAL FIELD

The present disclosure generally relates to the field of electronic device technology and, more particularly, relates to a display panel and a display drive circuit.

BACKGROUND

With continuous development of science and technology, more electronic devices with display functions are widely used in people's daily life. Electronic devices may become important tools which bring great convenience to people.

A display panel is a main component of the electronic device to realize display function. The OLED (organic light-emitting diode) display panel is one of current mainstream display panels. In the OLED display panel, sub-pixels are driven by pixel circuits for image display; and the pixel circuits need to perform scan control and provide light-emitting control signals through shift registers.

Existing shift registers have the tailing problem of output signals, which may affect the image display quality of the display panel.

SUMMARY

One aspect of the present disclosure provides a display drive circuit of a display panel. The display panel includes display units arranged in an array; a display unit includes a light-emitting element and a pixel circuit connected to the light-emitting element; and the pixel circuit includes a drive transistor, where a gate electrode of the drive transistor is connected to a first node, a first electrode of the drive transistor is connected to a second node, and a second electrode of the drive transistor is connected to a third node; a first reset transistor, where a gate electrode of the first reset transistor is configured to input a first signal, a first electrode of the first reset transistor is configured to input a reference voltage, and a second electrode of the first reset transistor is connected to the first node; a compensation transistor, where a gate electrode of the compensation transistor is configured to input a second signal, a first electrode of the compensation transistor is connected to the first node, and the second electrode of the compensation transistor is connected to the third node; and a data write transistor, where a gate electrode of the data write transistor is configured to input a third signal, and a first electrode of the data write transistor is configured to input a data signal, where the first signal and the second signal have a same period. The display drive circuit includes first shift registers from a first shift register of a 1st-stage to a first shift register of an Nth-stage, where N is a positive integer greater than 1, where first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal, $$t = a + b + c + d;\ A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; to is a horizontal period; and $t_0>0$; wherein X>1, the first shift register of each stage in the first shift registers of the last (N-A) stages is correspondingly connected to X rows of display units which are consecutively arranged; b is a number of the horizontal period occupied by a data write time length of the X rows of display units which are arranged consecutively and connected to a first shift register of a same stage; c is a delay of a third time relative to a second time; the second time is an end time of the number of the horizontal period occupied by the data write time length of the X rows of display units which are arranged consecutively and connected to the first shift register of the same stage; and the third time is a switch switching time of the second signal.

Another aspect of the present disclosure provides a display drive circuit of a display panel. The display panel includes display units arranged in an array; a display unit includes a light-emitting element and a pixel circuit connected to the light-emitting element; and the pixel circuit includes a drive transistor, where a gate electrode of the drive transistor is connected to a first node, a first electrode of the drive transistor is connected to a second node, and a second electrode of the drive transistor is connected to a third node; a first reset transistor, where a gate electrode of the first reset transistor is configured to input a first signal, a first electrode of the first reset transistor is configured to input a reference voltage, and a second electrode of the first reset transistor is connected to the first node; a compensation transistor, where a gate electrode of the compensation transistor is configured to input a second signal, a first electrode of the compensation transistor is connected to the first node, and the second electrode of the compensation transistor is connected to the third node; and a data write transistor, where a gate electrode of the data write transistor is configured to input a third signal, and a first electrode of the data write transistor is configured to input a data signal, where the first signal and the second signal have a same period. The display drive circuit includes first shift registers from a first shift register of a 1st-stage to a first shift register of an Nth-stage, where N is a positive integer greater than 1, where first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal, where $$t = a + b + c + d;\ A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; to is a horizontal period; and $t_0>0$; wherein X=1, the first shift register of each stage in the first shift registers of the last (N-A) stages is connected to one row of display units; b is a number of the horizontal period occupied by a data write time length of the one row of display units; c is a constant 0.

Another aspect of the present disclosure provides a a display panel. The display panel includes display units arranged in an array; a display unit includes a light-emitting element and a pixel circuit connected to the light-emitting element; and the pixel circuit includes a drive transistor, where a gate electrode of the drive transistor is connected to a first node, a first electrode of the drive transistor is connected to a second node, and a second electrode of the drive transistor is connected to a third node; a first reset transistor, where a gate electrode of the first reset transistor is configured to input a first signal, a first electrode of the first reset transistor is configured to input a reference voltage, and a second electrode of the first reset transistor is connected to the first node; a compensation transistor, where a gate electrode of the compensation transistor is configured to input a second signal, a first electrode of the compensation transistor is connected to the first node, and the second electrode of the compensation transistor is connected to the third node; and a data write transistor, where a gate electrode of the data write transistor is configured to input a third signal, and a first electrode of the data write transistor is configured to input a data signal, where the first signal and the second signal have a same period. The display drive circuit includes first shift registers from a first shift register of a 1st-stage to a first shift register of an Nth-stage, where N is a positive integer greater than 1, where first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal, where $$t = a + b + c + d; A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; $t_0$ is a horizontal period; and $t_0>0$; wherein X>1, the first shift register of each stage in the first shift registers of the last (N-A) stages is correspondingly connected to X rows of display units which are consecutively arranged; b is a number of the horizontal period occupied by a data write time length of the X rows of display units which are arranged consecutively and connected to a first shift register of a same stage; c is a delay of a third time relative to a second time; the second time is an end time of the number of the horizontal period occupied by the data write time length of the X rows of display units which are arranged consecutively and connected to the first shift register of the same stage; and the third time is a switch switching time of the second signal.

Other aspects of the present disclosure can be understood by those skilled in the art in light of the description, the claims, and the drawings of the present disclosure.

BRIEF DESCRIPTION OF THE DRAWINGS

In order to more clearly illustrate the technical solutions in embodiments of the present disclosure or related technologies, embodiments and accompanying drawings required for the description of the existing technology are briefly described hereinafter. Obviously, accompanying drawings in the following description are only used to describe embodiments of the present disclosure. For those skilled in the art, other drawings may also be obtained according to provided drawings without any creative effort.

The structures, proportions, sizes and the like shown in the drawings in the present disclosure are only used to cooperate with the contents disclosed in the present disclosure for understanding and reading of those skilled in the art, which may not be used to limit restrictive conditions that this application can implement and may not have technical substantive significance. Under the condition that produced effect and achieved purpose by the present disclosure are not affected, any modification of the structure, the change of the proportional relationship or the adjustment of the size should still fall within the scope that the technical content disclosed in the present disclosure can cover.

DETAILED DESCRIPTION

Embodiments of the present disclosure are clearly and completely described below with reference to the accompanying drawings in embodiments of the present disclosure. Obviously, described embodiments are only a part of embodiments of the present disclosure, but not all embodiments. According to embodiments in the present disclosure, all other embodiments obtained by those skilled in the art without creative efforts shall fall within the protection scope of the present disclosure.

Figure 1:
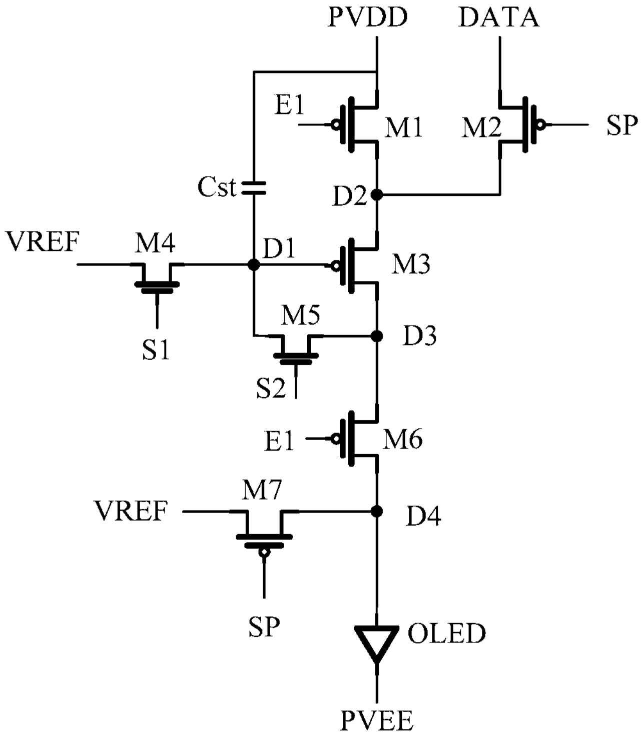
FIG. 1 illustrates a structural schematic of a pixel circuit in a display panel.

FIG. 1 illustrates a structural schematic of a pixel circuit in a display panel. The display panel may be an OLED (organic light-emitting diode) display panel, a light-emitting element in the display panel may be an OLED, and light-emitting display of the light-emitting element may be controlled by a pixel circuit. The pixel circuit diagram shown in FIG. 1 may be a 7T1C pixel circuit, including seven transistors and one storage capacitor Cst. Seven transistors may be the first transistor M1 to the seventh transistor M7 in sequence.

The gate electrode of the first transistor M1 may input a light-emitting control signal E1, and the first electrode of the first transistor M1 may be connected to a first power supply voltage PVDD. The gate electrode of the second transistor M2 may input a third signal SP, and the first electrode of the second transistor M2 may be connected to a data signal DATA. The second electrode of the second transistor M2, the second electrode of the first transistor M1, and the first electrode of the third transistor M3 may all be connected to a second node D2. The gate electrode of the third transistor M3 may be connected to a first node D1, and the second electrode of the third transistor M3 may be connected to a third node D3. The gate electrode of the fourth transistor M4 may input a first signal S1, the first electrode of the fourth transistor M4 may be connected to a reference voltage VREF, and the second electrode of the fourth transistor M4 may be connected to the first node D1. The gate electrode of the fifth transistor M5 may be connected to a second signal S2, the first electrode of the fifth transistor M5 may be connected to the first node D1, and the second electrode of the fifth transistor M5 may be connected to the third node D3. The gate electrode of the sixth transistor M6 may be connected to the light-emitting control signal E1, the first electrode of the sixth transistor M6 may be connected to the third node D3, and the second electrode of the sixth transistor M5, the second electrode of the seventh transistor M7 and the anode of the OLED may all be connected to a fourth node D4. The gate electrode of the seventh transistor M7 may be connected to the third signal SP, and the first electrode of the seventh transistor M7 may be connected to the reference voltage VREF. The storage capacitor Cst may be connected between the first node D1 and the first electrode of the first transistor M1. The cathode of the OLED may be connected to a second power supply voltage PVEE.

The first power supply voltage PVDD and the second power supply voltage PVEE may be both DC voltages; and the second power supply voltage PVEE may be less than the first power supply voltage PVDD.

The fourth transistor M4 and the fifth transistor M5 may be IGZO (indium gallium zinc oxide) transistors. The fourth transistor M4 and the fifth transistor M5 may be NMOS (N-type metal-oxide-semiconductor) which are on when the level is high and off when the level is low. Other transistors may be LTPS (low temperature polysilicon) transistors. Other transistors may all be PMOS (P-type metal-oxide-semiconductor) which are on when the level is low and off when the level is high. Obviously, the type of each transistor in the pixel circuit may be configured as PMOS or NMOS according to requirements, which may not be limited according to embodiments of the present disclosure.

The third transistor M3 may be a drive transistor. The fourth transistor M4 may be a first reset transistor, configured to reset the voltage of the first node D1, thereby realizing the gate voltage reset of the drive transistor. The fifth transistor M5 may be a compensation transistor, configured to perform voltage compensation on the drive transistor. The seventh transistor M7 may be a second reset transistor, configured to reset the anode potential of the OLED.

It should be noted that, in embodiments of the present disclosure, the pixel circuit may not be limited to the 7T1C circuit shown in FIG. 1, and may also be a 6T1C, 8T1C circuit or any pixel circuit including the drive transistor, the first reset transistor and the compensation transistor.

In low frequency display, HTD (hybrid TFT display) pixel circuit design may be needed. Compared with the pixel circuit of pure LTPS transistors, the HTD pixel circuit may need a display drive circuit including multiple groups of shift registers to provide the first signal S1, the second signal S2, the third signal SP and the light-emitting control signal E1. As described below, in the 8T1C pixel circuit, the first signal S1 and the second signal S2 may need to be provided through the first scan circuit, and the third signal SP may need to be provided through the second scan circuit; furthermore, the control signal SP* may need to be provided through the third scan circuit.

Figure 2:
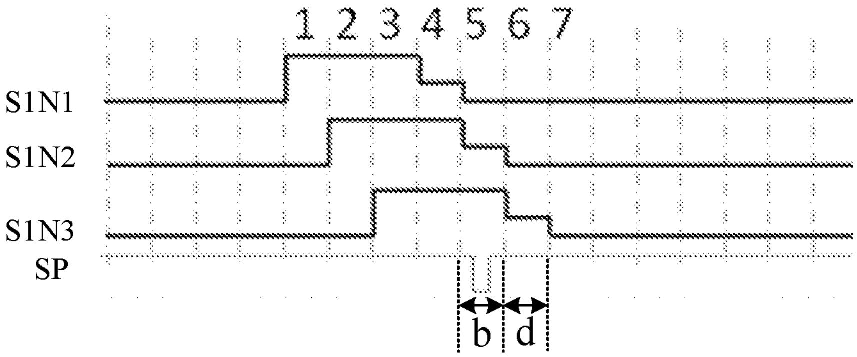
FIG. 2 illustrates a time sequence diagram of outputting signals of shift registers.

FIG. 2 illustrates a time sequence diagram of outputting signals of shift registers. FIG. 2 illustrates the time sequence diagram of the output signals of the first shift registers of three consecutive stages. The output signal of the first shift register of the first stage is S1N1, the output signal of the first shift register of the second stage is S1N2, and the output signal of the first shift register of the third stage is S1N3.

According to the time sequence diagram shown in FIG. 2, it can be known that there is a tailing problem when the output signal of the shift register is switched from a high level to a low level. According to the time sequence shown in FIG. 2, S1N1 may be configured as the first signal S1 of the pixel circuit shown in FIG. 1, and S1N3 may be configured as the second signal S2 of the pixel circuit. If the third signal SP is in the tailing stage of the output signal S1N1 of the shift register of the first stage, that is, in time segment 4 in FIG. 2, it may cause leakage current from the first node D1 to the first electrode of the fourth transistor M4, which may affect the potential accuracy of the first node D1, thereby resulting in the problem of OLED undesired display in the black screen and affecting the display quality.

Embodiments of the present disclosure provide a display panel, a display drive circuit, and a display drive method. The first shift registers of first A stages in the display drive circuit may be configured as virtual shift registers; and A is configured to satisfy $$A = \frac{t}{t_0 * X}$$

to form a particular drive time sequence, which may improve the characteristics of the drive transistors, solve the display problem caused by the tailing problem of the output signals of the first shift registers, and improve image display quality.

In order to make the above objectives, features and advantages of the present disclosure more clearly understood, the present disclosure is described in further detail below with reference to accompanying drawings and specific embodiments.

Figure 3:
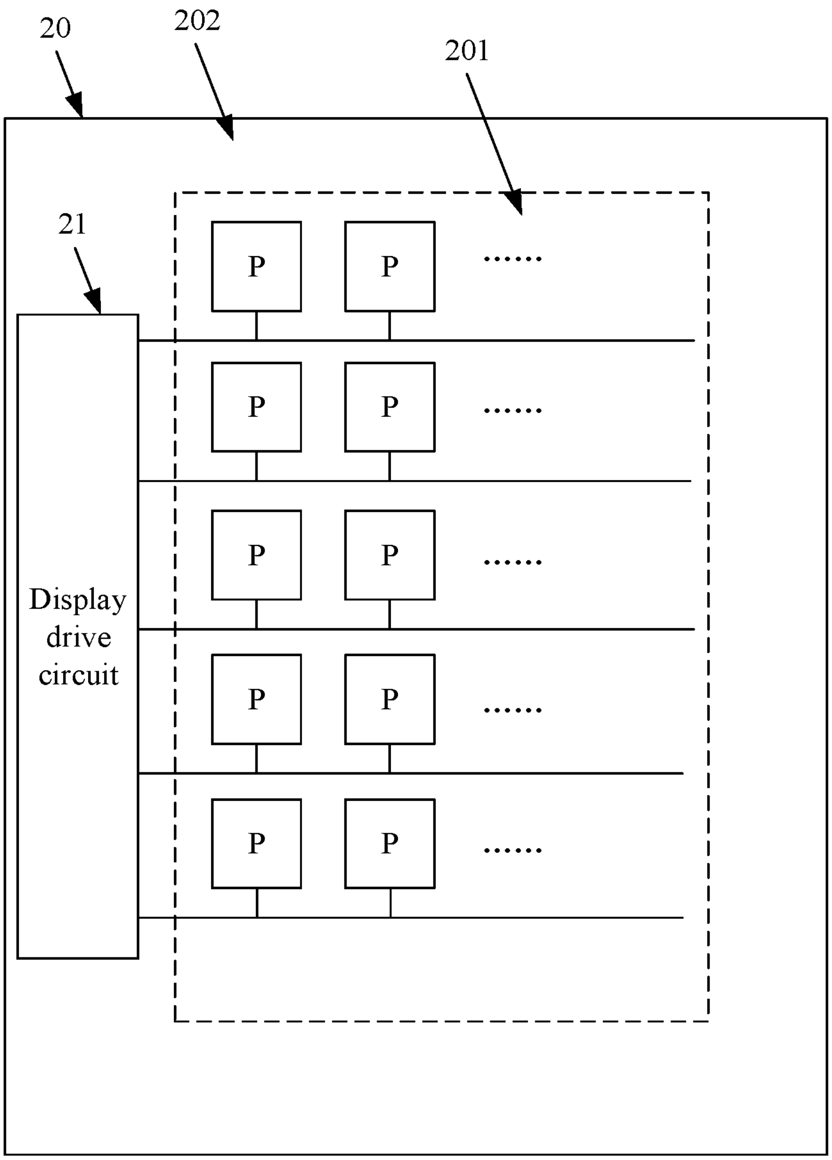
FIG. 3 illustrates a structural schematic of a display panel according to various embodiments of the present disclosure.
Figure 4:
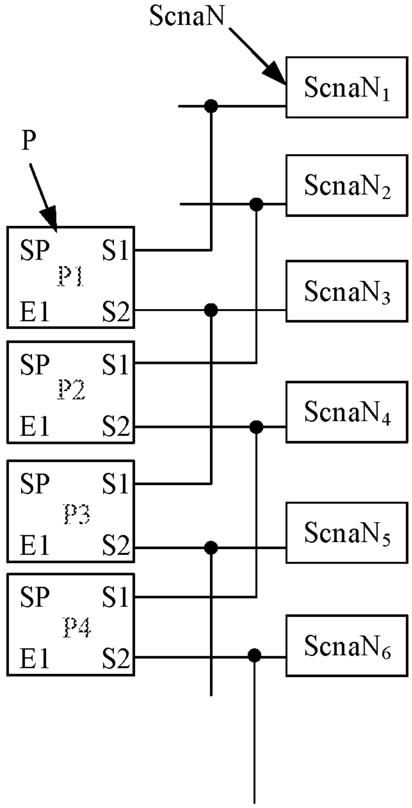
FIG. 4 illustrates a schematic of a connection relationship between first shift registers and pixel circuits in a display panel shown in FIG. 3.

Referring to FIGS. 3-4, FIG. 3 illustrates a structural schematic of a display panel according to various embodiments of the present disclosure; and FIG. 4 illustrates a schematic of a connection relationship between first shift registers and pixel circuits in a display panel shown in FIG. 3.

As shown in FIG. 3, the display panel 20 may include display units arranged in an array. The display unit may include a light-emitting element and a pixel circuit P connected to the light-emitting element. The light-emitting element to which the pixel circuit P is connected is not shown in FIG. 3. The light-emitting element may be an OLED; and the connection between the OLED and the pixel circuit P may refer to FIG. 1.

The pixel circuit P may include a drive transistor where the gate electrode of the drive transistor is connected to the first node D1, the first electrode of the drive transistor is connected to the second node D2, and the second electrode of the drive transistor is connected to the third node D3; include a first reset transistor where the gate electrode of the first reset transistor is configured to input the first signal S1, the first electrode of the first reset transistor is configured to input the reference voltage VREF, and the second electrode of the first reset transistor is connected to the first node D1; include a compensation transistor where the gate electrode of the compensation transistor is configured to input the second signal S2, the first electrode of the compensation transistor is connected to the first node D1, and the second electrode of the compensation transistor is connected to the third node D3; and further include a data write transistor where the gate electrode of the data write transistor is configured to input the third signal SP, and the first electrode of the data write transistor is configured to input the data signal DATA. The first signal S1 and the second signal S2 may have a same period.

The pixel circuit P may be the 7T1C pixel circuit shown in FIG. 1, the second transistor M2 may be the data write transistor, the third transistor M3 may be the drive transistor, the fourth transistor M4 may be the first reset transistor, and the fifth transistor M5 may be the compensation transistor.

The display panel may have a display drive circuit 21. The display drive circuit 21 may be connected to the pixel circuit P for providing the pixel circuit with the first signal S1, the second signal S2, and the third signal SP.

As shown in FIG. 4, the display drive circuit 21 may include N stages of cascaded first shift registers ScnaN which may sequentially be the first shift register $ScnaN_1$ of the first stage to the first shift register $ScnaN_N$ of the Nth-stage, where N is a positive integer greater than 1. The output signals of the first shift register $ScnaN_1$ of the first stage to the first shift register $ScnaN_N$ of the Nth-stage may be S1N1 to S1NN sequentially.

FIG. 4 illustrates the first shift registers from the first shift register $ScnaN_1$ of the first stage to the first shift register ScnaN6 of the 6th-stage; and illustrates pixel circuits in any one column of light-emitting elements from the pixel circuit P1, which is connected to the light-emitting element of the first row, to the pixel circuit P4, which is connected to the light-emitting element in the fourth row.

In embodiments of the present disclosure, in the display drive circuit 21, the first shift registers ScnaN of first A stages may be virtual shift registers which may be at least configured to make inputted second signal S2 of a same pixel circuit P have a delay of the set time length t relative to the first signal S1, where A is a positive integer greater than 1. The first shift register ScnaN of last (N-A) stages may be at least configured to provide the pixel circuits P with the second signal S2.

The time sequence of the display drive circuit 21 may satisfy the following relationship:

$$t = a + b + c + d,\ A = \frac{t}{t_0 * X} \tag{1}$$

where a is a delay of a turn-on time segment of the third signal relative to a first time; the first time is a time when the first signal is turned off; d is a switching time length of the second signal; X is a row number of display units connected to a first shift register of each stage in the first shift registers of the last (N-A) stages; t0 is a normalization coefficient of b; and t0>0.

The first signal S1 and the second signal S2 may have a same period and a same switching time length. If the second signal S2 has no tail when switching from a high level to a low level, the switching time length of the switch may be 0. If the second signal S2 has a tail, the switch switching time length (i.e., the switching time length of a switch) may be from the end time of the high level of the second signal S2 to the start time of adjacent low level. For example, S1N3 in FIG. 2 may be taken as the second signal S2, so that the switch switching time length may be time segment 6.

Taking that the transistor inputted with the third signal SP is PMOS as an example, the transistor may be turned on when the third signal SP is at a low level and turned off when the third signal SP is at a high level. At this point, the turn-on time segment of the third signal SP may be the low-level time segment of the third signal SP, such as the time segment 5 in FIG. 2.

Taking the first reset transistor being an NMOS as an example, the first reset transistor may be in conduction when the first signal S1 is at a high level and turned off when the first signal S1 is at a low level. The turn-off time of the first signal S1 may be the time when the first signal S1 is completely switched to the low level. As shown in FIG. 2, S1N1 is configured as the first signal S1, so that the turn-off time of the first signal S1 may be the turn-on time of the low level where the tailing is ended, that is, the start time of the time segment 5.

In the manner shown in FIG. 4, X=1, that is, in the first shift registers ScnaN of the last (N-A) stages, the first shift register ScnaN of each stage may be connected to a row of display units, and virtual shift registers of the A stages may be required. The first shift registers ScnaN of the last (N-A) stages and the display unit rows may be in a one-drive-one drive mode. For example, the pixel circuits P of a same row of display units may be correspondingly connected to the first shift register ScnaN of one stage; and the pixel circuits P of the display units in different rows may be connected to different first shift registers ScnaN. At this point, b is the data write time length of a row of display units; and c is a constant 0.

When X=1, as shown in FIG. 2, one time sequence period of the pixel circuit may include a plurality of time segments according to the time sequence. Referring to FIGS. 1-4, for the pixel circuits P connected to the display units of the first row, S1N1 may be configured as the first signal S1, and S1N3 may be configured as the second signal S2 in FIG. 2.

According to the time sequence shown in FIG. 2, in time segment 1 and time segment 2, the first signal may be a high level, and M4 may be turned on to reset the first node D1; in time segment 3, both M4 and M5 may be turned on, VREF may be written into the second node D2 through the third node D3 and M3, and a current may be formed in M3 to improve hysteresis characteristics of M3. The influence of previous picture on the bias voltage of M3 may be reduced, and the influence of previous picture on current picture to be displayed may be improved, thereby improving image display quality. In time segment 4, due to the tailing problem of S1N1, the stable potential may not be reached. Therefore, if the third signal SP is turned on at this point, a leakage current from the first node D1 to the first electrode of M4 may be generated through M4, which may affect the accuracy of the potential of the first node D1. In embodiments of the present disclosure, in time segment 5, the third signal SP may be turned on, M3 may be in conduction, the second signal S2 may be a high level, M5 may be in conduction, and the data signal DATA may be written into the first node D1 through M2 and M5.

It can be seen that when X=1, the time sequence signal generated according to the display drive circuit provided in embodiments of the present disclosure may improve the hysteresis characteristics of the drive transistor, reduce the influence of previous picture on the bias voltage of the drive transistor, improve the influence of previous picture on current picture to be displayed, and improve the image display quality. In addition, the third signal SP may be turned on after the tailing stage of the first signal S1, which may solve the display problem caused by the tailing, and further improve the image display quality.

In order to shorten the time sequence period and improve the response speed, it may set a=0. That is, for a pixel circuit P, after the start time of the low level of the first signal S1, that is, after complete turn-off time of the first signal S1, the third signal SP may be turned on. As shown in FIG. 2, the third signal SP may be turned on at the start time of the time segment 5.

In the display panel 20, for the first shift register ScnaN with a known circuit structure, after the connection relationship between the pixel circuit P and the first shift register ScnaN is determined, b, c, d and t0 may be known parameters. As shown in FIG. 2, when X=1, it may set a=0. At this point, c=0, and $$\frac{b}{t_0} + \frac{d}{t_0} = 2X$$

may be substituted in above-mentioned relational expression to obtain A=2. That is, for the one-drive-one drive mode, only two stages of virtual shift registers may be needed to realize above-mentioned time sequence, which may improve the hysteresis characteristic of the drive transistor and also avoid the display problem caused by the tailing of the output signal of the first shift register ScnaN. Obviously, corresponding to the one-drive-one drive mode, A may be configured to be greater than 2, that is, at least two stages of virtual shift registers may be configured, which may also realize above-mentioned time sequence control. When X=1, general expression may be $$\frac{b}{t_0} = \frac{d}{t_0}.$$

In embodiments of the present disclosure, the value of X may be configured according to drive requirements, which may not be limited to the one-drive-one drive mode with X=1; and X>1 may also be configured. At this point, in the first shift registers ScnaN of the last (N-A) stages, the first shift register ScnaN of each stage may be simultaneously connected to a plurality of pixel circuits of the display units which are consecutively arranged; the A stage virtual shift registers may be also needed; and the first shift registers ScnaN of the last (N-A) stages and the display unit rows may be in one-drive-multiple drive mode.

In the one-drive-multiple drive mode, for X rows of display units which are arranged consecutively and connected to the first shift register ScnaN of a same stage, the pixel circuit P of the last row of display units in the X rows of display units may need the second node D2 to compensate the first node D1; after the inputted third signal SP of the pixel circuits P of the display units in the last row is turned off, the inputted second signal S2 may need to have a delay of c time segment before entering the turn-off time, which may avoid the brightness difference of odd rows and even rows of the display unit.

Figure 5:
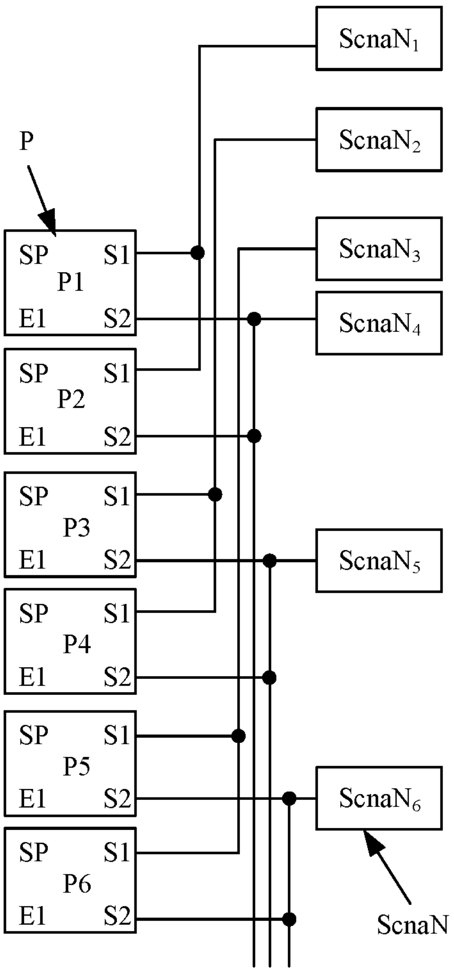
FIG. 5 illustrates another schematic of a connection relationship between first shift registers and pixel circuits in a display panel shown in FIG. 3.
Figure 6:
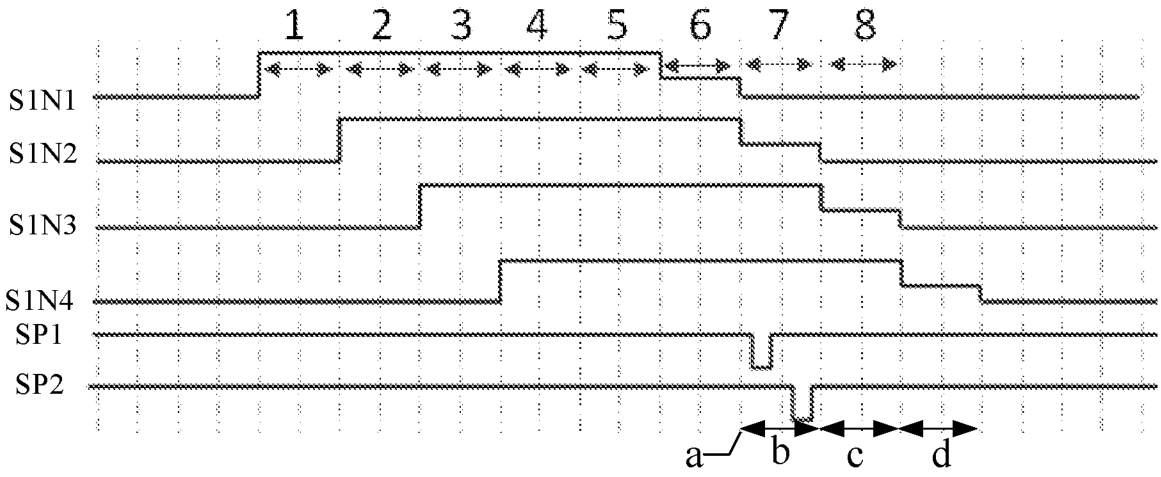
FIG. 6 illustrates a time sequence diagram of outputting signals of a first shift register of each stage in the circuit structure shown in FIG. 5.

When X>1, take X=2 as an example, at this point, the connection circuit between the first shift registers ScnaN and the display units may be shown in FIG. 5, and the time sequence of the display drive circuit 21 may be shown in FIG. 6.

FIG. 5 illustrates another schematic of a connection relationship between first shift registers and pixel circuits in the display panel shown in FIG. 3. FIG. 6 illustrates a time sequence diagram of outputting signals of the first shift register of each stage in the circuit structure shown in FIG. 5. For such manner, in the first shift registers ScnaN of the last (N-A) stages, the first shift register ScnaN of each stage may be correspondingly connected to the pixel circuits P of the display units in two adjacent rows. The first shift registers ScnaN of the last (N-A) stages and the display unit rows may be in one-drive-two drive mode.

If X>1, in the first shift registers ScnaN of the last (N-A) stages, the first shift register ScnaN of each stage may be correspondingly connected to X rows of display units which are consecutively arranged. In above relational expression (1), b is the data write time length of the X rows of display units which are arranged consecutively and connected to the first shift register ScnaN of a same stage; c is the delay of the third time relative to the second time; the second time is the data write end time of the X rows of display units which are arranged consecutively and connected to the first shift register ScnaN of a same stage; and the third time is the switching time of the second signal S2. When X>1, along the column direction of the display units, the pixel circuits P of each two adjacent rows of display units may individually correspond to the first shift register ScnaN of a stage in the first shift registers ScnaN of the last (N-A) stages.

Taking the one-drive-two drive mode shown in FIGS. 5-6 as an example, X=2, inputted third signal SP corresponding to the pixel circuits P of the display units of the first row may be SP1, and inputted third signal SP corresponding to the pixel circuits P of the display units of the second row may be SP2. S1N1 may be inputted first signal S1 of the pixel circuits P of the display units of the first row and the second row, and S1N4 may be inputted second signal S2 of the pixel circuits P of the display units of the first row and the second row. b is the data write time length of two rows of display units which are arranged consecutively and connected to the first shift register ScnaN of a same stage in the first shift registers ScnaN of the last (N-A) stages. For the display units of the first row and the second row, the second time may be the data write end time in the display units of the second row, that is, the end time of the time segment 7 in FIG. 6; and the third time may be the switching time of the second signal S2, that is, the time when the second signal S2 starts to decrease from the high level, that also is, the end time of the time segment 8 in FIG. 6.

In embodiments of the present disclosure, the first signal S1 and the second signal S2 are both described by taking that the controlled transistor is an NMOS as example; and the NMOS is turned on at a high level. Therefore, the turn-off time of the first signal S1 and the second signal S2 may be the start time of the low level; the turn-on time may be the start time of the high level; the switch switching time may be the end time of the high level. If the output signal of the first shift register ScnaN has an output tailing problem, the switch switching time length may be the tailing time length, which is greater than 0, and if there is no output tailing problem, the switch switching time length may be 0. For the third signal SP, since the controlled transistor is a PMOS, the PMOS may be turned on at a low level, so that the start time segment of SP may be the continuation time length of its low level.

When X>1, similarly, it may set a=0 to shorten the time sequence period and improve the response speed.

When X=2, as shown in FIG. 6, one time sequence period of the pixel circuit may include a plurality of time segments according to the time sequence. Combined with the one-drive-two drive mode shown in FIGS. 1, 3, 5 and 6, for the pixel circuits P connected to the display units of the first row and the second row, referring to FIG. 6, S1N1 may be configured as the first signal S1, S1N4 may be configured as the second signal S2, the third signal SP connected to the pixel circuit P of the display unit of the first row may be SP1, and the third signal SP connected to the pixel circuit P of the display unit of the second row may be SP2.

According to the time sequence shown in FIG. 6, time segment 1 to time segment 3 may be reset time segments of the first node D1, the first signal may be at a high level, M4 may be turned on, and the first node D1 may be reset. In time segment 4 and segment 5, M4 and M5 may be turned on simultaneously, VREF may be written into the second node D2 through the third node D3 and M3, and a current may be formed in M3, which may improve the hysteresis characteristic of M3, reduce the influence of the bias voltage of previous picture on M3, improve the influence of previous picture on current picture to be displayed, and improve the image display quality. At the time segment 6, due to the tailing problem of S1N1, stable potential may not be reached; so that if the SP is turned on at this point, a leakage current from the first node D1 to the first electrode of M4 may be generated through M4, which may affect potential accuracy of the first node D1. For example, the first electrode of M4 may be connected to Vref potential, and the current at the first node may be leaked to Vref through M4. Therefore, in time segment 7, SP1 and SP2 may be turned on in sequence, M3 may be turned on, the second signal S2 may be at a high level, M5 may be turned on, and the data signal DATA may be written to the first node D1 through M2 and M5. In time segment 8, from SP1 turn-on to SP2 turn-on, the second signal S2 may be always in the turn-on state. SP2 may only be the data signal threshold compensation stage of the pixel circuit P in the display unit of the second row. However, after SP1 performs data signal threshold compensation on the data signal of the pixel circuit P in the display unit of the first row, the second signal S2 may be still turned on. A part of remaining charges stored in the second node D2 may be still used for data signal threshold compensation when SP2 is turned on, so that the pixel circuits P of the display units of the first row and the second row, which are acted on by SP1 and SP2 respectively, may have a potential difference at the first node D1. In embodiments of the present disclosure, the turn-on state of the second signal S2 may be configured to last at least c time segment after the data end of the pixel circuit P of the display unit of the second row, that is, time segment 8 may be configured. In such way, the pixel circuit connected to SP2 may also have the data signal threshold compensation stage of the second node D2; and at this stage, the pixel circuit P of the display unit of the second row may basically flow all node charges of the second node D2 into the first node D1. That is, the charge of the second node D2 of the pixel circuits P in the display units of the first row and the second row may be basically released to the first node D1. Therefore, the difference problem of the light-emitting brightness of the display units of odd and even rows may be solved, and the display quality may be improved.

It can be seen from above description that for the one-drive-two drive mode, according to time sequence signals generated by the display drive circuit provided in embodiment of the present disclosure, above relational expression (1) may be satisfied, which may improve the hysteresis characteristics of the drive transistor, reduce the influence of previous picture on the bias voltage of the drive transistor, improve the influence of previous picture on current picture to be displayed, and improve the image display quality. Furthermore, the third signal SP may be turned on after the tailing stage of the first signal S1, which may solve the display problem caused by the tailing, further improve the image display quality, and also solves the display brightness difference of odd and even rows.

It can be seen that time sequence signals generated by the display drive circuit provided in embodiments of the present disclosure may have four stages of resetting the first node D1, improving current hysteresis characteristics of M3, writing the data signal DATA to the first node D1, and compensating the first node D1 by the second node D2 to solve the display brightness difference of odd and even rows, which may realize desirable display effect.

In the display panel 20, for the first shift register ScnaN with a known circuit structure, after the connection relationship between the pixel circuit P and the first shift register ScnaN is determined, b, c, d and t0 may be known parameters. When X>1, it may set a=0. At this point, $$\frac{b}{t_0} + \frac{c}{t_0} + \frac{d}{t_0} = 3X$$

may be substituted into above relational expression to obtain A=3. That is, for the one-drive-multiple drive mode, only three stages of virtual shift registers may be needed to realize that above time sequence may have four stages of resetting the first node D1, improving current hysteresis characteristics of the M3, writing the data signal DATA to the first node D1, and compensating the first node D1 by the second node D2 to solve the display brightness difference of odd and even rows, which may realize desirable display effect. Obviously, corresponding to the one-drive-multiple drive mode, A may be set to be greater than 3, that is, at least three stages of virtual shift registers may be configured, and above time sequence control may also be realized. When X>1, $$\frac{b}{t_0} = \frac{c}{t_0} = \frac{d}{t_0},$$

thereby being convenient for realizing control.

When X>1, a virtual shift register may be needed to enable the second signal S2 to generate a delay time segment relative to the first signal S1. According to such delay time segment, the reset of the first node D1 may be before the threshold compensation of the drive transistor. A second virtual shift register may be needed to enable the second signal S2 to generate a second delay time segment relative to the first signal S1, so that the third signal SP may avoid the tailing stage of the first signal S1; and the data signal may be written after the tailing of the first signal S1 ends. A third virtual shift register may be needed to enable the second signal S2 to generate a third delay time segment relative to the first signal S1. After the third signal SP inputted by the pixel circuit P of the last row in the X rows of display units which are arranged consecutively and connected to a same first shift register is turned off, the first signal S1 may be delayed for a period of time to be turned off, thereby realizing that the second node D2 compensates the first node D1. Therefore, when X>1, at least three stages of virtual shift registers may be configured, so that in a same pixel circuit P, the second signal S2 may have a delay of at least time length t relative to the first signal S1.

Figure 7:
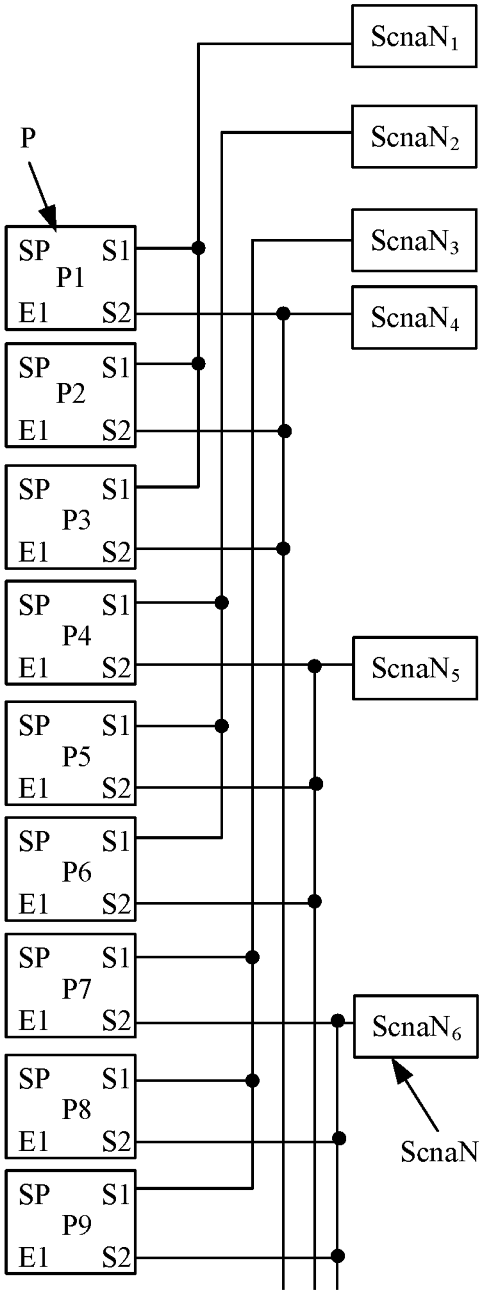
FIG. 7 illustrates another schematic of a connection relationship between first shift registers and pixel circuits in a display panel shown in FIG. 3.
Figure 8:
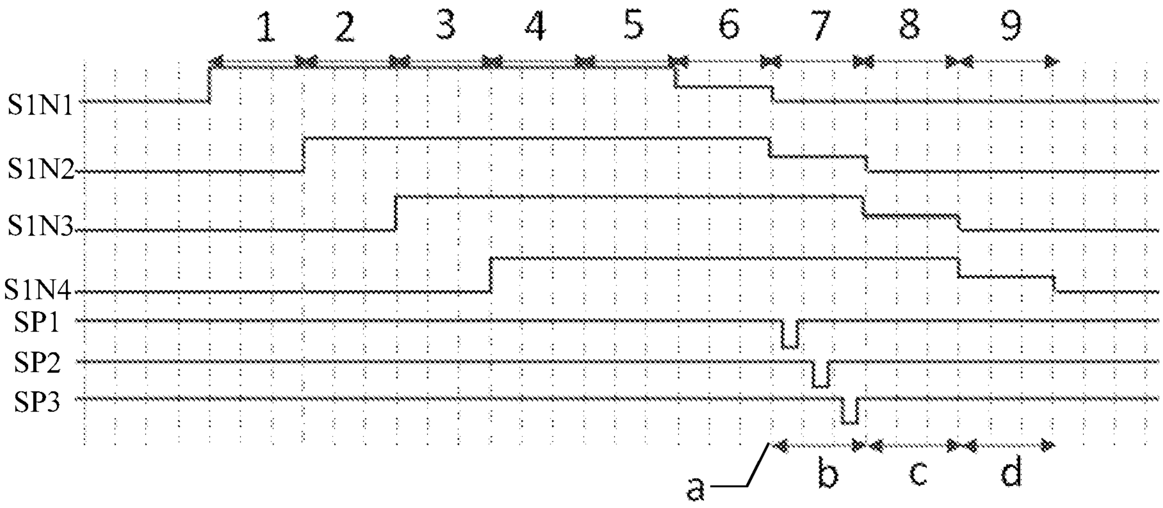
FIG. 8 illustrates a time sequence diagram of outputting signals of a first shift register of each stage in the circuit structure shown in FIG. 7.

When X>1, taking X=3 as an example, at this point, the connection circuit between the first shift registers ScnaN and the display units may be as shown in FIG. 7, and the time sequence of the display drive circuit 21 may be as shown in FIG. 8.

FIG. 7 illustrates another schematic of a connection relationship between first shift registers and pixel circuits in a display panel shown in FIG. 3. FIG. 8 illustrates a time sequence diagram of outputting signals of the first shift register of each stage in the circuit structure shown in FIG. 7. For such manner, in the first shift registers ScnaN of the last (N-A) stages, the first shift register ScnaN of each stage may be correspondingly connected to the pixel circuits P of the three rows of the display units which are consecutively arranged. The first shift registers ScnaN of the last (N-A) stages and the display unit rows may be in one-drive-three drive mode.

In the one-drive-three drive mode, A=3 may be taken as an example for illustration. Referring to FIGS. 1, 3, 7 and 8, X=3, and corresponding inputted third signals SP of the pixel circuits P of the display units from the first row to the third row may be SP1, SP2, and SP3 in sequence. S1N1 may be inputted first signal S1 of the pixel circuits P of the display units from the first row to the third row; and S1N4 may be inputted second signal S2 of the pixel circuits P of the display units from the first row to the third row. b may be the data write time of three rows of display units which are arranged consecutively and connected to the first shift register ScnaN of a same stage in the first shift registers ScnaN of the last (N-A) stages. For the display units from the first row to the third row, the second time may be the data write end time in the display units of the third row, that is, the end time of time segment 7 in FIG. 8; and the third time may be the switching time of the second signal S2, that is, the time when the second signal S2 starts to decrease from the high level, that also is, the end time of the time segment 8 in FIG. 8.

Similar to X=2, when X=3, according to the time sequence shown in FIG. 8, time segment 1 to time segment 3 may be the reset time segment of the first node D1; time segment 4 and time segment 5 may be the M3 turn-on current stage to improve the hysteresis characteristics of M3; time segment 6 may be the S1N1 tailing time segment, and SP may need to be turned on after time segment 6; in time segment 7, SP1/SP2/SP3 may be turned on in sequence, and the data signal DATA may be sequentially written into the pixel circuits P of the display units from the first row of to the third row; and in time segment 8, the second node D2 may be implemented to compensate the first node D1.

Therefore, for the one-drive-three drive mode, the time sequence signal generated according to the display drive circuit provided by embodiments of the present disclosure may also satisfy above-mentioned relational expression (1) and may have four stages of resetting the first node D1, improving current hysteresis characteristics of the M3, writing the data signal DATA to the first node D1, and compensating the first node D1 by the second node D2 to solve the display brightness difference of odd and even rows, which may desirably realizing display effect.

Figure 9:
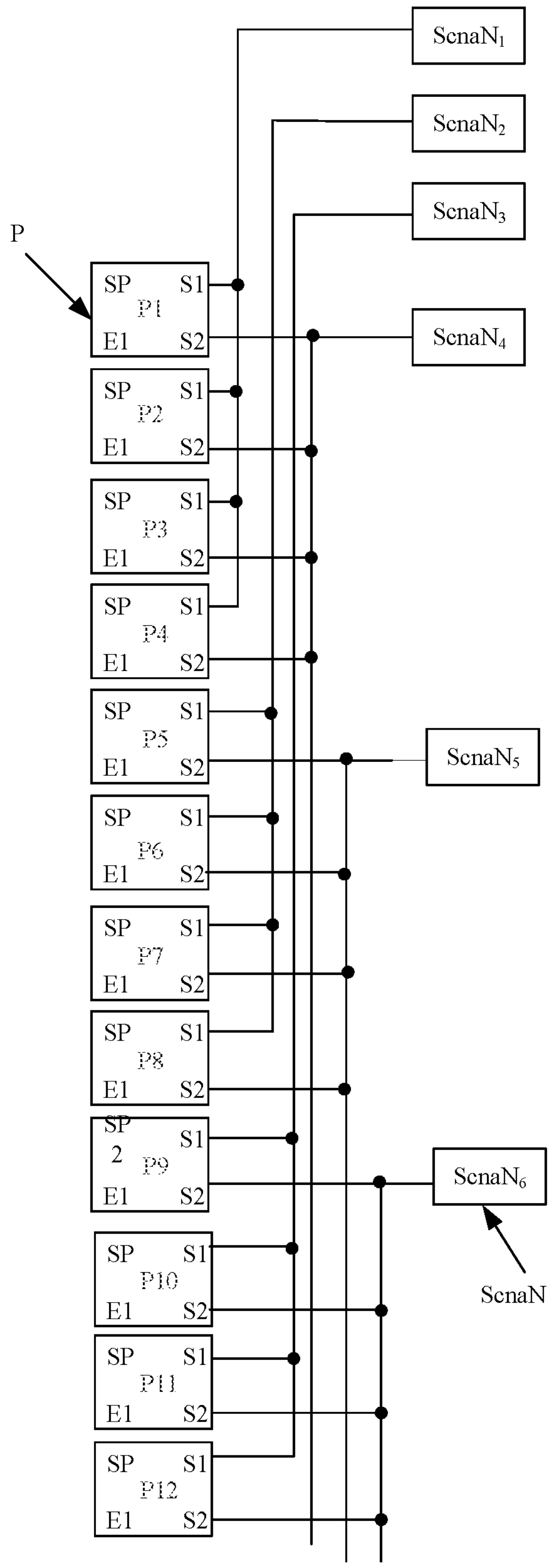
FIG. 9 illustrates another schematic of a connection relationship between first shift registers and pixel circuits in a display panel shown in FIG. 3.
Figure 10:
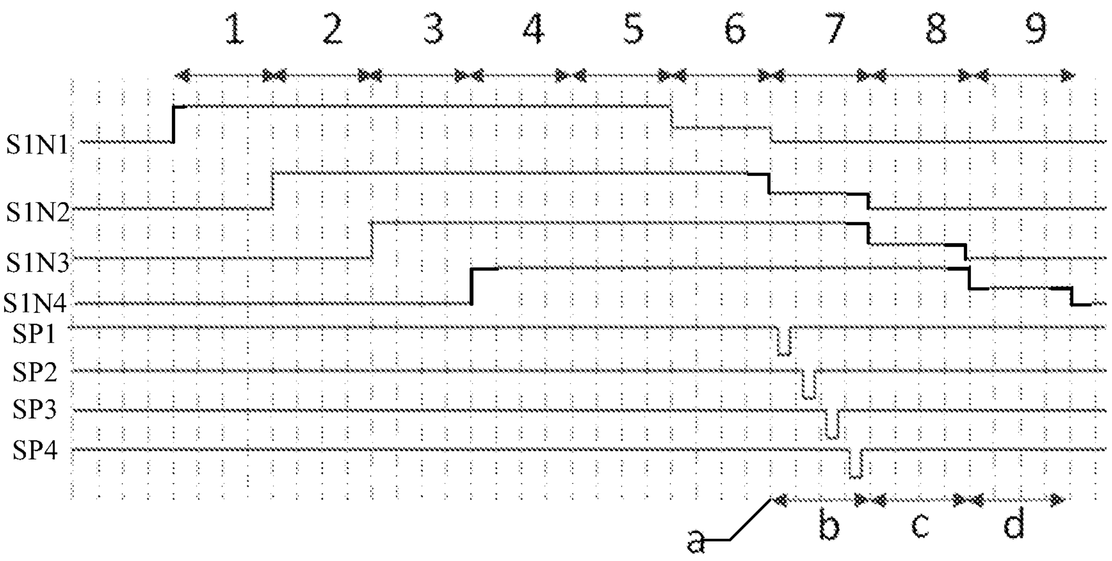
FIG. 10 illustrates a time sequence diagram of outputting signals of a first shift register of each stage in the circuit structure shown in FIG. 9.

When X>1, taking X=4 as an example, the connection circuit between the first shift registers ScnaN and the display units may be as shown in FIG. 9, and the time sequence of the display drive circuit 21 may be as shown in FIG. 10.

FIG. 9 illustrates another schematic of a connection relationship between first shift registers and pixel circuits in a display panel shown in FIG. 3. FIG. 10 illustrates a time sequence diagram of outputting signals of the first shift register of each stage in the circuit structure shown in FIG. 9. For such manner, in the first shift registers ScnaN of the last (N-A) stages, the first shift register ScnaN of each stage may be correspondingly connected to the pixel circuits P of 4 rows of the display units which are consecutive arranged. The first shift registers ScnaN of the last (N-A) stages and the display unit rows may use a one-drive-four drive mode.

In one-drive-four drive mode, A=3 may be taken as an example for illustration. Referring to FIGS. 1, 3, 9 and 10, X=4, and corresponding inputted third signals SP of the pixel circuits P of the display units from the first row to the fourth row may be SP1, SP2, SP3, and SP4 in sequence. S1N1 may be inputted first signal S1 inputted of the pixel circuits P of the display units from the first row to the fourth row; and S1N4 may be inputted second signal S2 of the pixel circuits P of the display units from the first row to the fourth row. b may be the data write time of four rows of display units which are arranged consecutively and connected to the first shift register ScnaN of a same stage in the first shift registers ScnaN of the last (N-A) stages. For the display units from the first row to the fourth row, the second time may be the data write end time in the display units of the fourth row, that is, the end time of time segment 7 in FIG. 10; and the third time may be the switching time of the second signal S2, that is, the time when the second signal S2 starts to decrease from the high level, that also is, the end time of the time segment 8 in FIG. 8.

Similar to X=2, when X=4, according to the time sequence shown in FIG. 10, time segment 1 to time segment 3 may be the reset time segment of the first node D1; time segment 4 and time segment 5 may be the M3 turn-on current stage to improve the hysteresis characteristics of M3; time segment 6 may be the S1N1 tailing time segment, and SP may need to be turned on after time segment 6; in time segment 7, SP1/SP2/SP3 may be turned on in sequence, and the data signal DATA may be sequentially written to the pixel circuits P of the display units from the first row to the fourth row; and in time segment 8, the second node D2 may be implemented to compensate the first node D.

Therefore, for the one-drive-four drive mode, the time sequence signal generated according to the display drive circuit provided by embodiments of the present disclosure may also satisfy above-mentioned relational expression (1), and may have four stages of resetting the first node D1, improving current hysteresis characteristics of the M3, writing the data signal DATA to the first node D1, and compensating the first node D1 by the second node D2 to solve the display brightness difference of odd and even rows, which may desirably realizing display effect.

When d>0, for a same row of display units, the display drive circuit 21 may be configured to turn on the first reset transistor to reset the voltage of the first node D1 when the first signal S1 is turned on and the second signal S2 is turned off; configured to, when the first signal S1 and the second signal S2 are turned on simultaneously, turn on the first reset transistor and the compensation transistor simultaneously, such that the drive transistor may be in conduction and the current through the drive transistor may be formed to perform voltage reset on the second node D2; and configured to turn on the third signal SP after the switch switching time of the first signal S1 is delayed by at least the time length d, and within time segment when the second signal S2 is maintained to be on. The third signals SP inputted by different rows of display units may not be overlapped with each other. In such way, the time sequence may have resetting the first node D1, improving current hysteresis characteristics of M3 and writing the data signal DATA to the first node D1, and the write data signal stage being in the tailing stage of the first signal S1 may be avoided, thereby ensuring desirable display effect. As described above, by setting the c delay stage, it may realize that the second node D2 may compensate the first node D1 in four stages to solve the display brightness difference of odd and even rows.

In embodiments of the present disclosure, the pixel circuits P of the display units in a same row may be inputted with a same first signal S1, a same second signal S2 and a third signal SP.

The display drive circuit 21 may include a first scan circuit and a second scan circuit.

The first scan circuit may have cascaded multi-stage first shift registers ScnaN; and the first shift register ScnaN may be configured to provide the first signal S1 or the second signal S2 to the connected display unit. In the first shift registers ScnaN of two adjacent stages, the output signal of the first shift register ScnaN of a previous stage may be configured as the input signal of the first shift register ScnaN of a next stage; and the output signals of the first shift register ScnaN of the previous stage and the first shift register ScnaN of the next stage may have a turn-on delay of the first time length, where the first time length is equal to b.

FIGS. 4, 5, 7 and 9 illustrate the connection manners of the first shift registers ScnaN in the first scan circuit and the pixel circuits P in the display units under different drive modes.

Figure 11:
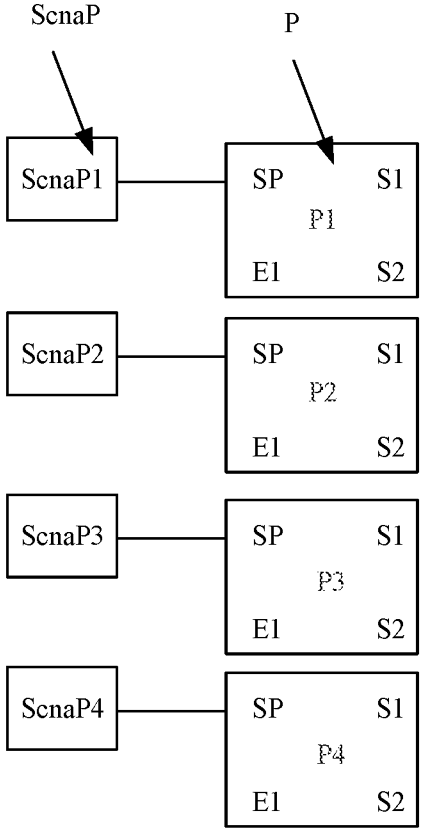
FIG. 11 illustrates a schematic of a connection relationship between second shift registers in a second scan circuit and pixel circuits in display units according to various embodiments of the present disclosure.

FIG. 11 illustrates a schematic of a connection relationship between second shift registers in the second scan circuit and pixel circuits in the display units according to various embodiments of the present disclosure. The second scan circuit may include cascaded multi-stage second shift registers ScnaP; and the second shift register ScnaN may be configured to provide the third signal SP to the connected display unit. In two adjacent second shift registers ScnaP, the output signal of the second shift register ScnaP of a previous stage may be configured as the input signal of the second shift register ScnaP of a next stage; and the output signals of the former second shift register ScnaP and the next second shift register ScnaP may have a turn-on delay. The display panel 21 may be configured to have M rows of display units, where M is a positive integer greater than 1. The second scan circuit may have second shift registers from the second shift register ScnaP1 of the first stage to the second shift register ScnaP of the Mth-stage, which may output the signals from SP1 to SPM in sequence as the third signals SP of connected pixel circuits P. The output terminal of the second shift register ScnaP1 of the ith-stage may be connected to the gate electrode of the data write transistor in the display unit of the ith row.

The display panel 20 may have a display region 201 and a frame region 202 surrounding the display region 201. The display drive circuit 21 may be in the frame region 202, and the display unit may be in the display region 201. The display panel 20 may be configured to have M rows of display units, where M is a positive integer greater than 1.

When X=1, that is, when the one-drive-one drive mode is used, N=M+A. The first scan circuit may include the first shift registers from the first shift register $ScnaN_1$ of the first stage to the first shift register $ScnaN_{M+A}$ of an (M+A)th-stage. The gate electrode of the first reset transistor in the display unit of the ith row may be connected to the output terminal of the first shift register ScnaNi of the ith-stage to input the first signal S1, where i is a positive integer not greater than M. The gate electrode of the compensation transistor in the display unit of the ith row may be connected to the output terminal of the first shift register $ScnaN_{A+i}$ of an (A+i)th-stage to input the second signal S2.

As shown in FIG. 4, in an example of X=1, as A=2, then i=1 indicates that the gate electrode of the first reset transistor in the display unit of the first row may be connected to the output terminal of the first shift register $ScnaN_1$ of the first stage to input the first signal S1; and the gate electrode of the compensation transistor in the display unit of the first row may be connected to the output terminal of the first shift register ScnaN3 of the third stage to input the second signal S2.

When X>1, M rows of display units may be equally divided into a plurality of display unit groups along the column direction of the array, and the display unit groups may include a plurality of rows of display units arranged consecutively along the column direction. The first scan circuit may be configured to make the pixel circuits P connected to a same group of display units to be inputted with a same first signal S1 and a same second signal S2. In two adjacent display unit groups, the delay time of inputted first signal S1 of a next display unit group relative to inputted first signal S1 of a previous display unit group may be b. For the display units in a same row, the delay time of inputted second signal S2 relative to inputted first signal S1 may be not less than 3b. In such way, the first scan circuit may realize the particular time sequence of above-mentioned relational expression (1) through three-stage virtual shift registers, thereby realizing desirable image display effect.

When X>1, that is, when the one-drive-multiple drive mode is used, display unit groups from a first display unit group to an mth display unit group may be along the column direction, where m is a positive integer less than M, M is an integer multiple of m, and N=m+A. The first scan circuit may include the first shift registers from the first shift register $ScnaN_1$ of the first stage to the shift register $ScnaN_{m+A}$ of an (m+A)th-stage. The gate electrode of the first reset transistor in a jth display unit group may be connected to the output terminal of the first shift register $ScnaN_j$ of a jth-stage to input the first signal S1, where j is a positive integer not greater than m. The gate electrode of the compensation transistor in the jth display unit group may be connected to the output terminal of the first shift register $ScnaN_{A+j}$ of an (A+j)th-stage to input the second signal S2.

If X=2 and A=3, each display unit group may have two consecutive rows of display units. When j=1, as shown in FIG. 5, the first display unit group may include the display units of the first row and the second row. In the display units of the first row and the second row, the gate electrode of the first reset transistor may be connected to the output terminal of the first shift register $ScnaN_1$ of the first stage to input the first signal S1; and the gate electrode of the compensation transistor may be connected to the output terminal of the first shift register $ScnaN_4$ of the fourth-stage to input the second signal S2.

If X=3 and A=3, each display unit group may have three consecutive rows of display units. When j=1, as shown in FIG. 7, the first display unit group may include the display units from the first row to the third row. In the display units from the first row to the third row, the gate electrode of the first reset transistor may be connected to the output terminal of the first shift register $ScnaN_1$ of the first stage to input the first signal S1; and the gate electrode of the compensation transistor may be connected to the output terminal of the first shift register $ScnaN_4$ of the fourth-stage to input the second signal S2.

If X=4 and A=3, each display unit group may have four consecutive rows of display units. When j=1, as shown in FIG. 9, the first display unit group may include the display units from the first row to the fourth row. In the display units from the first row to the fourth row, the gate electrode of the first reset transistor may be connected to the output terminal of the first shift register $ScnaN_1$ of the first stage to input the first signal S1; and the gate electrode of the compensation transistor may be connected to the output terminal of the first shift register $ScnaN_4$ of the fourth-stage to input the second signal S2.

When X is greater than 1, X=2, 3, or 4. When X is greater than 1, the one-drive-multiple drive mode may be implemented, and the number of the first shift registers ScnaN in the display drive circuit may be reduced, thereby reducing the width of the frame region 202. It should be noted that the value of X may be set according to requirements and may not be limited to the value of X given in embodiments of the present disclosure. X may be any positive integer.

In the display drive circuit 21 provided by embodiments of the present disclosure, the first shift register ScnaN may include a pull-down output module, which may be configured to control the first shift register ScnaN output a low level according to time sequence, where a storage unit may be connected to the control terminal of the pull-down output module, and the storage unit may make d>0. The control terminal of the pull-down output module in the first shift register ScnaN may be directly connected to the storage unit, such that the circuit structure may be simple. When the output signal of the first shift register ScnaN is converted from a high level to a low level, the circuit structure that the control terminal of the pull-up output module is directly connected to the storage unit may affect the coupling effect between the output terminal of the first shift register ScnaN and the control terminal of the pull-down output module, which may result in d>0 and cause the output signal to have tailing. However, according to the time sequence that satisfies above-mentioned relational expression (1) in the present disclosure, the display problem caused by the tailing of the output signal may be solved, and the circuit structure may be relatively simple.

Figure 12:
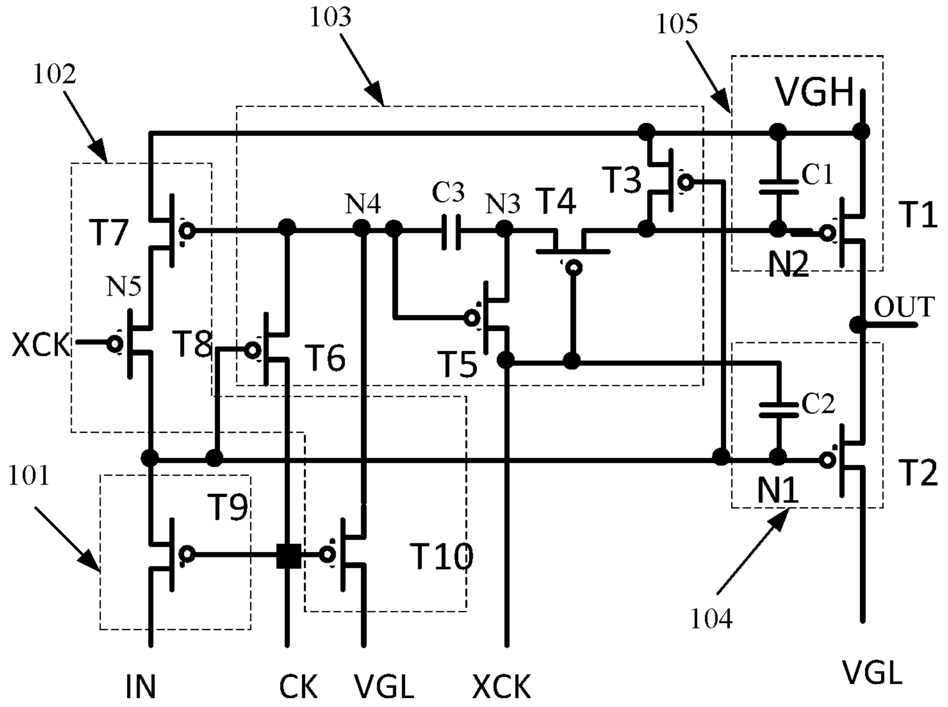
FIG. 12 illustrates a circuit diagram of a first shift register according to various embodiments of the present disclosure.

FIG. 12 illustrates a circuit diagram of a first shift register according to various embodiments of the present disclosure. The first shift register shown may include an input module 101, configured to output a fourth signal according to an input signal IN; a pull-down control module 102, configured to control the potential of a first connection point N1 according to a first clock signal XCK, a high level VGH, a low level VGL, the fourth signal and a second clock signal CK; a pull-up control module 103, configured to control the potential of a second connection point N2 according to the first clock signal XCK, the second clock signal CK, the high level VGH and the fourth signal; a pull-down output module 104, configured to control an output terminal OUT of the first shift register to output the low level VGL according to the potential of the first connection point N1 and the low level VGL; and a pull-up output module 105, configured to control the output terminal OUT to output the high level VGH according to the potential of the second connection point N2 and the high level VGH.

The first shift register shown in FIG. 12 may output period-switched high-level VGH and low-level VGL, which are configured as the first signal S1 or the second signal S2 of the pixel circuit, according to the time sequence control of the first clock signal XCK and the second clock signal CK.

When the output signal of the first shift register is switched from the high level VGH to the low level VGL, the memory cell (i.e., the second capacitor C2) directly connected to the first connection point N1 may affect the coupling effect between the output terminal OUT and the first connection point N1, which may result in that the potential of the first connection point N1 cannot be rapidly reduced to fully turned-on potential of the pull-down output module 104, thereby causing the output signal tailing problem. However, the circuit may have a simple structure, may not need to add an isolation module to isolate the storage unit and the first connection point N1, and may solve the influence of the tailing problem on the display quality according to particular time sequence of the present disclosure.

As shown in FIG. 12, the pull-up output module 105 may include a first switch transistor T1, where the gate electrode of the first switch transistor T1 is connected to the second connection point N2, the first electrode of the first switch transistor T1 is configured to input the high level VGH, and the second electrode of the first switch transistor T1 is connected to the output terminal OUT of the first shift register; and include a first capacitor C1 connected between the gate electrode of the first switch transistor T1 and the first electrode. The pull-up output module 105 may respond to the control of the pull-up control module 103 to output the high level VGH in time sequence through the first switch transistor T1 and the first capacitor C1, and the circuit structure may be simple.

As shown in FIG. 12, the pull-down output module 104 may include a second switch transistor T2, where the gate electrode of the second switch transistor T2 is connected to the first connection point N1, the first electrode of the second switch transistor T2 is connected to the output terminal OUT of the first shift register, and the second electrode of the second switch transistor T2 is configured to input the low level VGL; further include a second capacitor C2, where one electrode plate is connected to the first connection point N1, and the other electrode plate is configured to input the first clock signal XCK. The second capacitor C2 may be a storage unit, and the gate electrode of the second switch transistor T2 may be the control terminal of the pull-down output module 104. The pull-down output module 104 may respond to the control of the pull-down control module 102 to output the low level VGL in time sequence through the second switch transistor T2 and the second capacitor C2, and the circuit structure may be simple.

As shown in FIG. 12, the pull-up control module 103 may include a third switch transistor T3, where the gate electrode of the third switch transistor T3 is connected to the first connection point N1, the first electrode of the third switch transistor T3 is configured to input the high level VGH, and the second electrode of the third switch transistor T3 is connected to the second connection point N2; a fourth switch transistor T4, where the gate electrode of the fourth switch transistor T4 is configured to input the first clock signal XCK, the first electrode of the fourth switch transistor T4 is connected to the third connection point N3, and the second electrode of the fourth switch transistor T4 is connected to the second connection point N2; a fifth switch transistor T5, where the gate electrode of the fifth switch transistor T5 is connected to the fourth connection point N4, the first electrode of the fifth switch transistor T5 is connected to the third connection point N3, and the second electrode of the fifth switch transistor T5 is configured to input the first clock signal XCK; and a sixth switch transistor T6, where the gate electrode of the sixth switch transistor T6 is configured to input the fourth signal, the first electrode of the sixth switch transistor T6 is connected to the fourth connection point N4, and the second electrode of the sixth switch transistor T6 is configured to input the second clock signal CK. A third capacitor C3 may be connected between the third connection point N3 and the fourth connection point N4. The pull-up control module 103 may realize the pull-up control through the third switch transistor T3 to the sixth switch transistor T6 and the third capacitor C3, and the circuit structure may be simple.

As shown in FIG. 12, the pull-down control module 102 may include a seventh switch transistor T7, where the gate electrode of the seventh switch transistor T7 is connected to the fourth connection point N4, the first electrode of the seventh switch transistor T7 is configured to input the high level VGH, and the second electrode of the seventh switch transistor T7 is connected to the fifth connection point N5; an eighth transistor T8, where the gate electrode of the eighth transistor T8 is configured to input the first clock signal XCK, the first electrode of the eighth transistor T8 is connected to the fifth connection point N5, and the second electrode of the eighth transistor T8 is configured to input the fourth signal; and a ninth switch transistor T10, where the gate electrode of the ninth switch transistor T10 is configured to input the second clock signal CK, the first electrode of the ninth switch transistor T10 is connected to the fourth connection point N4, and the second electrode of the ninth switch transistor T10 is configured to input the low level VGL. The pull-down control module 102 may realize pull-down control through the seventh switch transistor T7, the eighth transistor T8, and the ninth switch transistor T10, and the circuit structure may be simple.

As shown in FIG. 12, the input module 101 may include a tenth switch transistor T9, where the gate electrode of the tenth switch transistor T9 is configured to input the second clock signal CK, the first electrode of the tenth switch transistor T9 is configured to output the fourth signal, and the second electrode of the tenth switch transistor T9 is configured to input the input signal IN. The input module 101 may be controlled to output the fourth signal according to the time sequence of the second clock signal CK through the tenth switch transistor T9, and the circuit structure may be simple.

It should be noted that, in embodiments of the present disclosure, the first shift register ScnaN in the display drive circuit 21 may also use a circuit structure without output tailing and at this point, d=0. According to the technical solutions of embodiments of the present disclosure and the time sequence corresponding to the relational expression (1), the time sequence signal may have four stages of resetting the first node D1, improving current hysteresis characteristics of the M3, write the data signal DATA to the first node D1, and compensating the first node D1 by the second node D2 to solve the display brightness difference of odd and even rows, which may desirably realize display effect.

The display drive circuit provided by embodiments of the present disclosure may not be limited to be used in a 7T1C pixel circuit, and also be used in a 6T1C pixel circuit or an 8T1C pixel circuit. The display drive circuit may be used for any pixel circuit including the drive transistor, the first reset transistor, and the compensation transistor.

Figure 13:
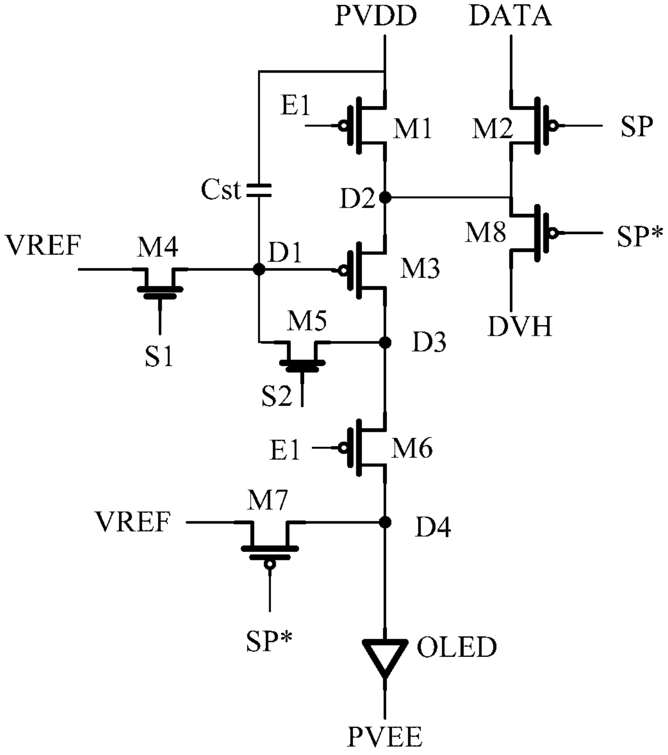
FIG. 13 illustrates another structural schematic of a pixel circuit in a display panel.

FIG. 13 illustrates another structural schematic of a pixel circuit in a display panel. The pixel circuit shown may be an 8T1C pixel circuit, including eight transistors and one storage capacitor Cst. The difference from the 7T1C pixel circuit shown in FIG. 1 may be that the 8T1C pixel circuit shown in FIG. 13 may also include the eighth transistor M8. The gate electrodes of the eighth transistor M8 and the seventh transistor M7 may be both connected to a control signal SP*; the first electrode of the eighth transistor M8 may be connected to the second node D2; and the second electrode may be connected to a DC high potential DVH.

For the 8T1C pixel circuit, the display drive circuit may further include a third scan circuit, configured for providing the pixel circuit P with the control signal SP*. The connection relationship between the first shift registers ScnaN and the pixel circuits P in the first scan circuit and the connection relationship between the second shift registers ScnaP and the pixel circuits P in the second scan circuit may be same as the connection relationship of above-mentioned 7T1C pixel circuit, which may not be limited in embodiments of the present disclosure.

The third scan circuit may include a plurality of cascaded third shift registers ScnaP*. The output signal of the third shift register ScnaP* of a previous stage may be configured as the input signal of the third shift register ScnaP* of a next stage. The third scan circuit may also be arranged in the frame region 202.

For the 8T1C pixel circuit, when the one-drive-one drive mode is used, the third shift registers ScnaP* may be connected to the display unit rows in a one-to-one correspondence. For example, when the display panel 20 has M rows of display units, the display panel 20 may have M stages of third shift registers ScnaP*. The M stages of third shift registers ScnaP* may be third shift registers sequentially from the third shift register ScnaP*1 of the first stage to the third shift register ScnaP* of the Mth-stage, which may output control signals SP*1 to SP*M sequentially. The gate electrodes of M7 and M8 in the display unit of the ith row may be connected to the output terminal of the third shift register ScnaP*i of the ith-stage, thereby inputting the control signal SP*i as the control signal SP of the display unit of the ith row.

For the 8T1C pixel circuit, when the one-drive-multiple drive mode is used, as described above, the display panel 20 may have M rows of display units. The M rows of display units may be equally divided into m display unit groups along the column direction of the array, the m display unit groups may sequentially be the first display unit group to the mth display unit group, and N=m+A. The third scan circuit may have m stages of third shift registers ScnaP*. The m stages of third shift registers ScnaP* may sequentially be the third shift registers from the third shift register ScnaP*1 of the first stage to the third shift register ScnaP*m of the mth-stage which may sequentially output control signals SP*1 to SP*m. The gate electrodes of M7 and M8 in the jth display unit group may be connected to the output terminal of the third shift register ScnaP*j of the jth-stage, thereby inputting the control signal SP* as the control signal SP of the jth display unit group.

Figure 14:
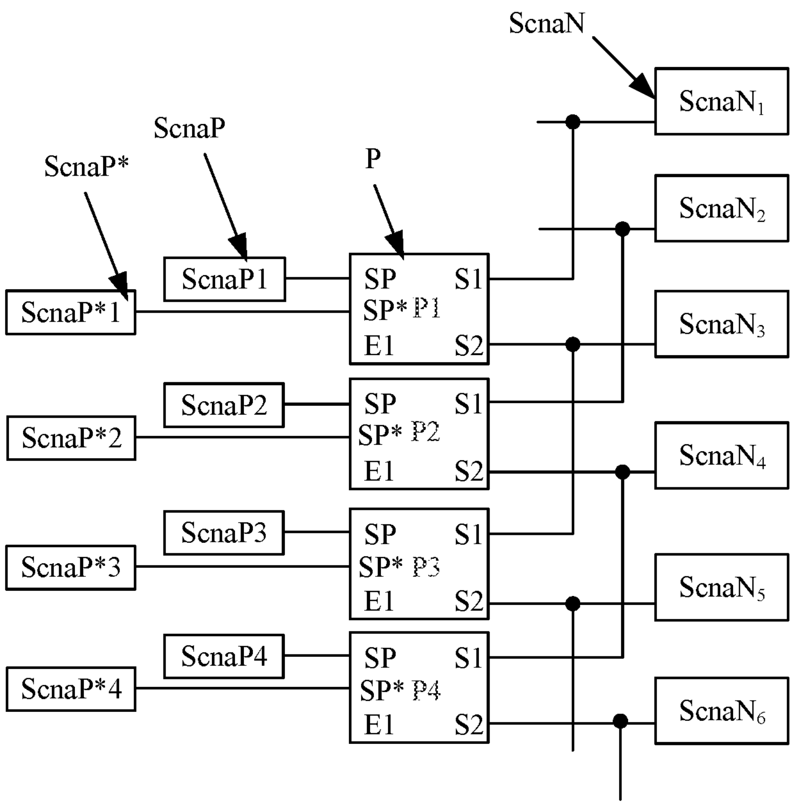
FIG. 14 illustrates a schematic diagram of a connection relationship between a display drive circuit and pixel circuits according to various embodiments of the present disclosure.
Figure 15:
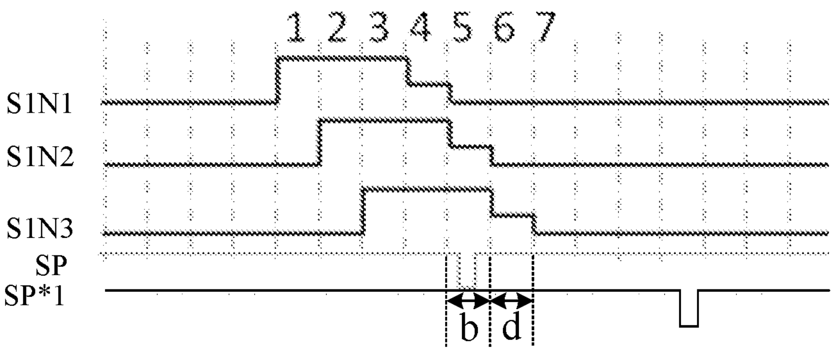
FIG. 15 illustrates a time sequence diagram for a one-drive-one drive mode according to various embodiments of the present disclosure.

For the 8T1C pixel circuit, when the one-drive-one drive mode is used, the connection between the display drive circuit and the pixel circuits is shown in FIG. 14, and the time sequence is shown in FIG. 15.

FIG. 14 illustrates a schematic diagram of a connection relationship between the display drive circuit and pixel circuits according to various embodiments of the present disclosure. FIG. 15 illustrates a time sequence diagram for the one-drive-one drive mode according to various embodiments of the present disclosure. According to the time sequence shown in FIG. 15, the working principle may be same as that of 7T1C; in one drive period, it may realize three stages of resetting the first node D1, improving current hysteresis characteristics of the M3, and writing the data signal DATA to the first node D1. Similarly, the stage of writing the data signal DATA in the first node D1 may be that the SP is turned on after the first signal tailing ends. At a set time after the second signal S2 is switched to a low level, SP*1 may be turned on, M8 may be turned on, a bias voltage may be applied to the second node D2 by DVH, which may be beneficial for realizing consistent characteristics of M3 of writing data frame and M3 of hold frame, thereby solving the display problem of low frequency flicker.

Figure 16:
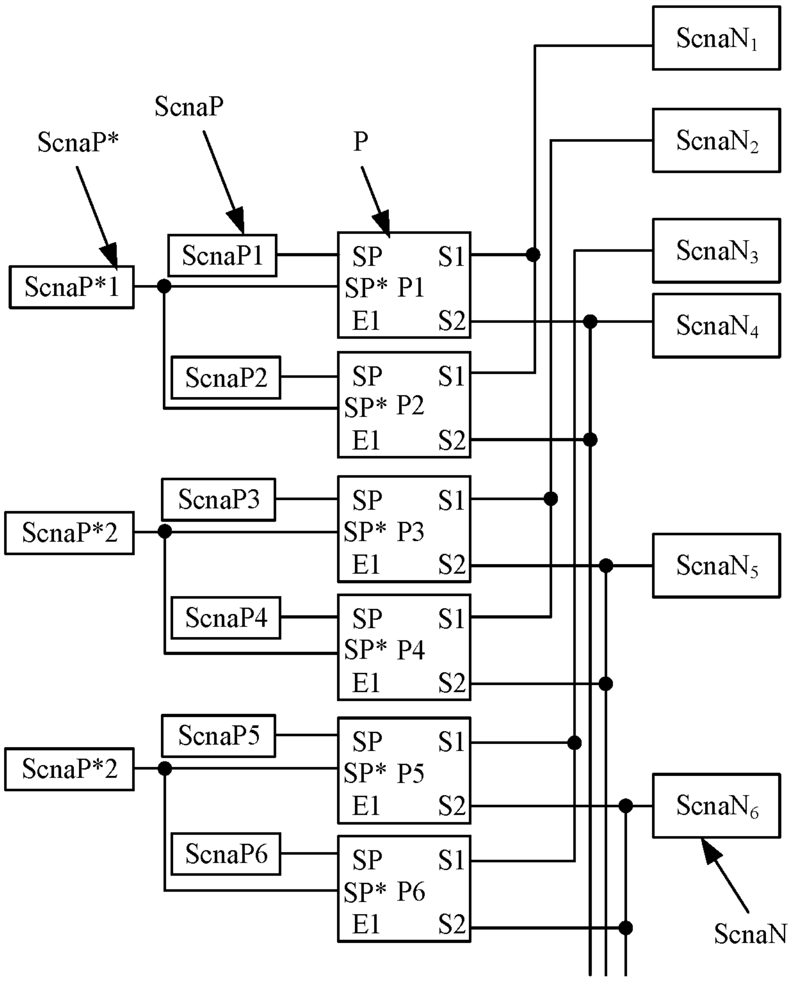
FIG. 16 illustrates another schematic diagram of a connection relationship between a display drive circuit and pixel circuits according to various embodiments of the present disclosure.
Figure 17:
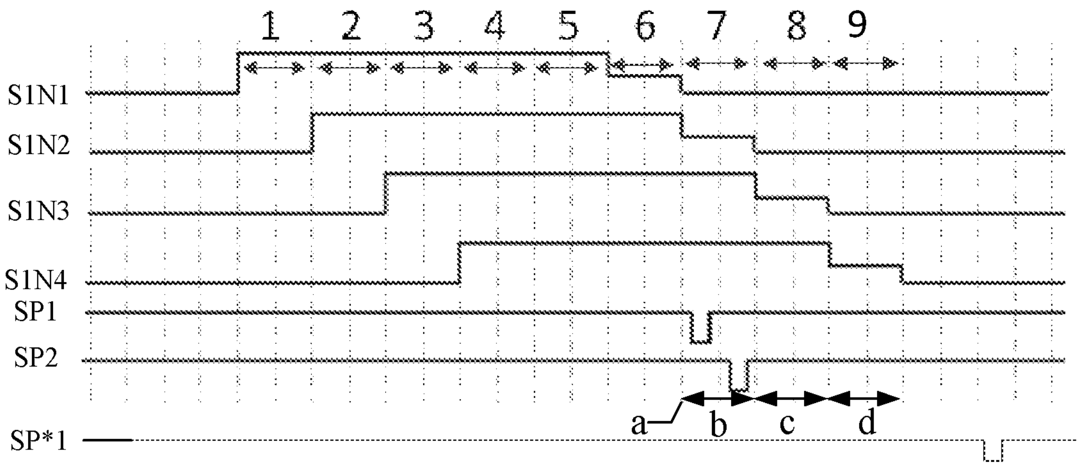
FIG. 17 illustrates a time sequence diagram for a one-drive-two drive mode according to various embodiments of the present disclosure.

For the 8T1C pixel circuit, when the one-drive-two drive mode is used, the connection between the display drive circuit and the pixel circuits is shown in FIG. 16, and the time sequence is shown in FIG. 17.

FIG. 16 illustrates another schematic diagram of a connection relationship between the display drive circuit and pixel circuits according to various embodiments of the present disclosure. FIG. 17 illustrates a time sequence diagram for the one-drive-two drive mode according to various embodiments of the present disclosure. According to the time sequence shown in FIG. 17, the working principle may be same as that of 7T1C; in one drive period, it may realize four stages of resetting the first node D1, improving current hysteresis characteristics of the M3, writing the data signal DATA to the first node D1, and compensating the first node D1 by the second node D2 to solve the display brightness difference of odd and even rows, which may realize desirable display effect. At a set time after the second signal S2 is switched to a low level, SP*1 may be turned on, M8 may be turned on, a bias voltage may be applied to the second node D2 by DVH, which may be beneficial for realizing consistent characteristics of M3 of writing data frame and M3 of hold frame, thereby solving the display problem of low frequency flicker.

Figure 18:
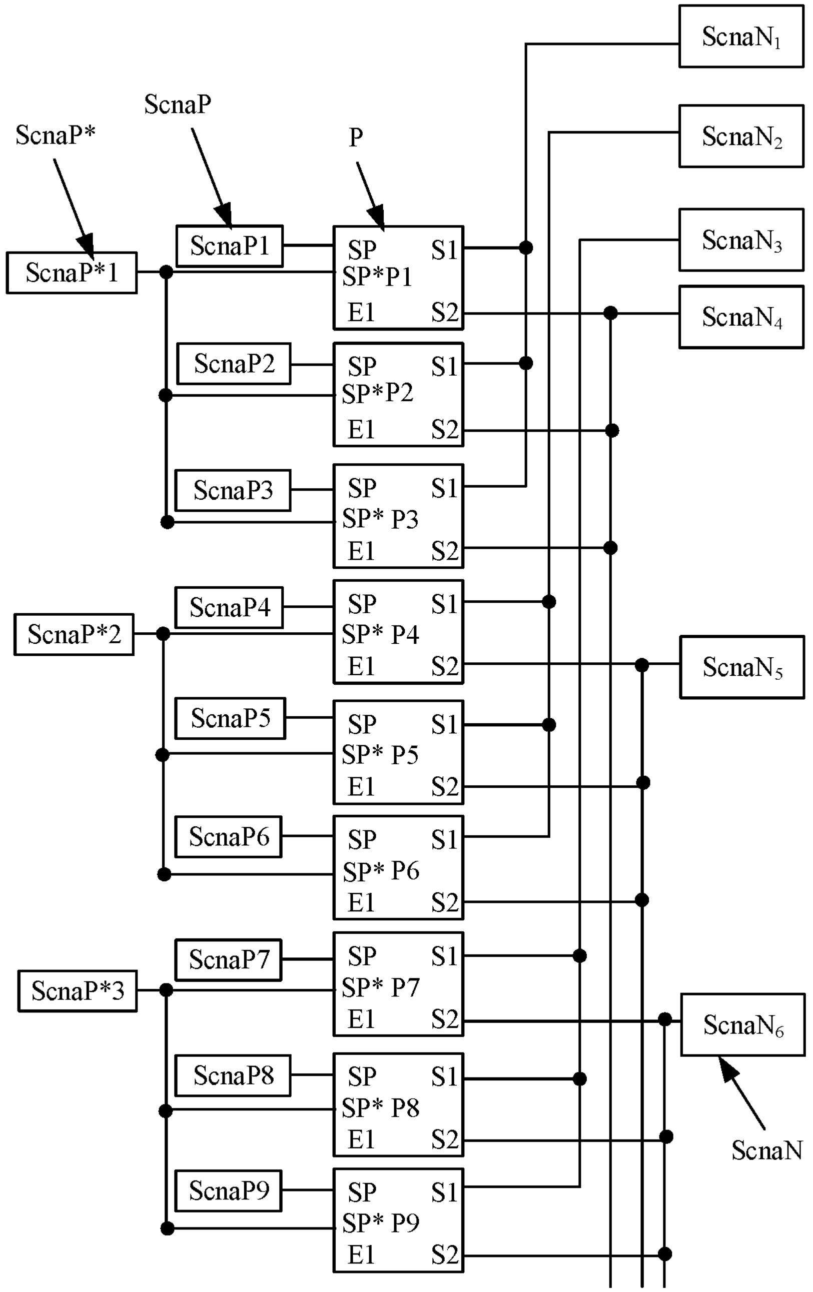
FIG. 18 illustrates another schematic diagram of a connection relationship between a display drive circuit and pixel circuits according to various embodiments of the present disclosure.
Figure 19:
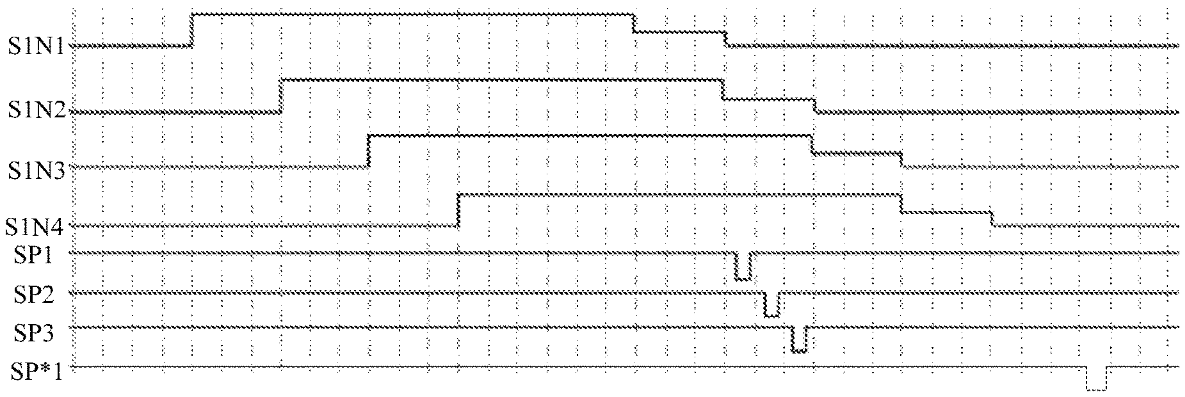
FIG. 19 illustrates a time sequence diagram for a one-drive-three drive mode according to various embodiments of the present disclosure.

For the 8T1C pixel circuit, when the one-drive-three drive mode is used, the connection between the display drive circuit and the pixel circuits is shown in FIG. 18, and the time sequence is shown in FIG. 19.

FIG. 18 illustrates another schematic diagram of a connection relationship between the display drive circuit and pixel circuits according to various embodiments of the present disclosure. FIG. 19 illustrates a time sequence diagram for the one-drive-three drive mode according to various embodiments of the present disclosure. According to the time sequence shown in FIG. 18, the working principle may be same as that of 7T1C; in one drive period, it may realize four stages of resetting the first node D1, improving current hysteresis characteristics of the M3, writing the data signal DATA to the first node D1, and compensating the first node D1 by the second node D2 to solve the display brightness difference of odd and even rows, which may realize desirable display effect. At a set time after the second signal S2 is switched to a low level, SP*1 may be turned on, M8 may be turned on, a bias voltage may be applied to the second node D2 by DVH, which may be beneficial for realizing consistent characteristics of M3 of writing data frame and M3 of hold frame, thereby solving the display problem of low frequency flicker.

Figure 20:
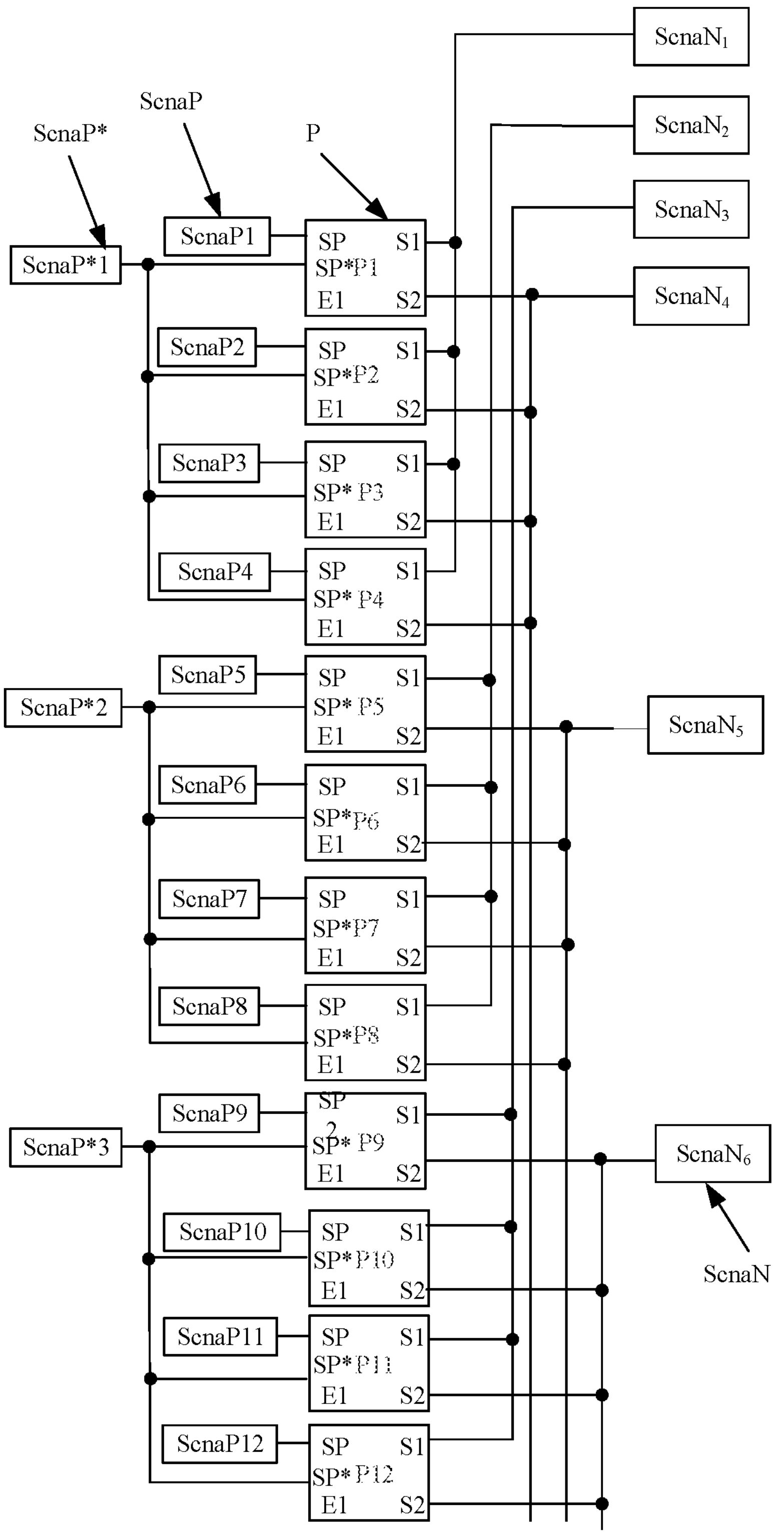
FIG. 20 illustrates another schematic diagram of a connection relationship between a display drive circuit and pixel circuits according to various embodiments of the present disclosure.
Figure 21:
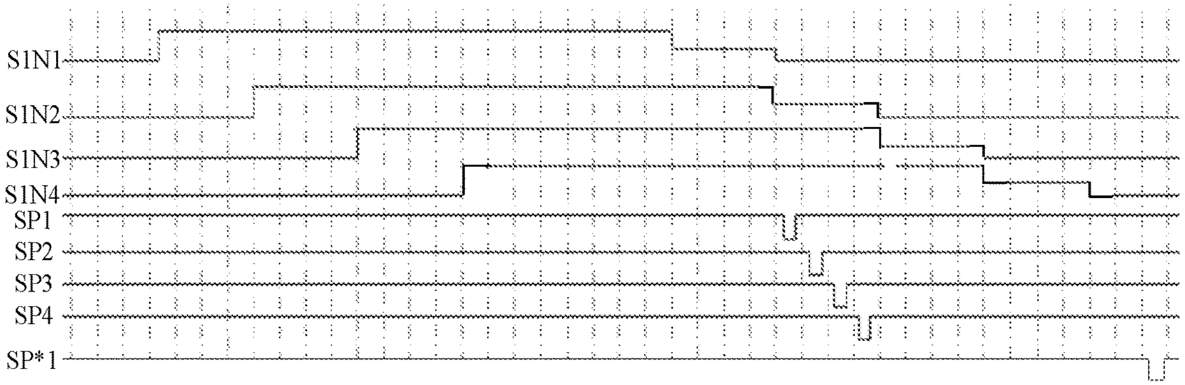
FIG. 21 illustrates a time sequence diagram for a one-drive-four drive mode according to various embodiments of the present disclosure.

For the 8T1C pixel circuit, when the one-drive-four drive mode is used, the connection between the display drive circuit and the pixel circuits is shown in FIG. 20, and the time sequence is shown in FIG. 21.

FIG. 20 illustrates another schematic diagram of a connection relationship between the display drive circuit and pixel circuits according to various embodiments of the present disclosure. FIG. 21 illustrates a time sequence diagram for the one-drive-four drive mode according to various embodiments of the present disclosure. According to the time sequence shown in FIG. 21, the working principle may be same as that of 7T1C; in one drive period, it may realize four stages of resetting the first node D1, improving current hysteresis characteristics of the M3, writing the data signal DATA to the first node D1, and compensating the first node D1 by the second node D2 to solve the display brightness difference of odd and even rows, which may realize desirable display effect. At a set time after the second signal S2 is switched to a low level, SP*1 may be turned on, M8 may be turned on, a bias voltage may be applied to the second node D2 by DVH, which may be beneficial for realizing consistent characteristics of M3 of writing data frame and M3 of hold frame, thereby solving the display problem of low frequency flicker.

It can be seen from above description that in embodiments of the present disclosure, the display drive circuit may realize a particular time sequence signal that satisfies the above relational expression (1), such that the pixel circuit may control the light-emitting element to perform image display with the time sequence signal, which may have three stages of resetting the first node D1, improving current hysteresis characteristics of the M3, and writing the data signal DATA to the first node D1. For the one-drive-multiple drive mode, it may further realize the stage control of compensating the first node D1 by the second node D2 to solve the display brightness difference of odd and even rows, which may realize desirable display effect.

According to above-mentioned embodiments, another embodiment of the present disclosure further provides a display panel. The structure of the display panel may be as shown in FIG. 3. The display panel may include display units. The display unit may include the light-emitting element and the pixel circuit P connected to the light-emitting element. Referring to the drawings of above-mentioned embodiments, the pixel circuit P may include the drive transistor where the gate electrode of the drive transistor is connected to the first node D1, the first electrode of the drive transistor is connected to the second node D2, and the second electrode of the drive transistor is connected to the third node D3; the first reset transistor where the gate electrode of the first reset transistor is configured to input the first signal S1, the first electrode of the first reset transistor is configured to input the reference voltage VREF, and the second electrode of the first reset transistor is connected to the first node D1; the compensation transistor where the gate electrode of the compensation transistor is configured to input the second signal S2, the first electrode of the compensation transistor is connected to the first node D1, and the second electrode of the compensation transistor is connected to the third node D3; and further include the data write transistor where the gate electrode of the data write transistor is configured to input the third signal SP, and the first electrode of the data write transistor is configured to input the data signal DATA. The first signal S1 and the second signal S2 may have a same period.

Referring to the drawings of above-mentioned embodiments, the display drive circuit may include the first shift registers from the first shift register $ScnaN_1$ of the first stage to the first shift register $ScnaN_N$ of the Nth-stage, where N is a positive integer greater than 1.

The first shift registers ScnaN of the first A stages may be virtual shift registers which may be at least configured to make that the inputted second signal S2 of a same pixel circuit P has a delay of the set time length t relative to the first signal S1, A is a positive integer greater than 1, and the first shift register ScnaN of the last (N-A) stages may be at least configured to provide the pixel circuits P with the second signal S2, where t=a+b+c+d, $$A = \frac{t}{t_0 * X},$$

a is the delay of the turned-on time segment of the third signal SP relative to the first time; the first time is the time when the first signal S1 is turned off; d is the switching time length of the second signal S2; X is the row number of the display units connected to the first shift register ScnaN of each stage in the first shift register ScnaN of the last (N-A) stages; t0 is the normalization coefficient of b; and t0>0.

When X=1, the first shift register ScnaN of each stage in the first shift registers ScnaN of the last (N-A) stages may be connected to one row of display units, b is the data write time length of the one row of display units, and c is a constant 0.

Or, when X>1, the first shift register ScnaN of each stage in the first shift registers ScnaN of last (N-A) stages may be correspondingly connected to X rows of display units which are consecutively arranged; b is the data write time length of the X rows of display units which are arranged consecutively and connected to the first shift register ScnaN of a same stage; c is the delay of the third time relative to the second time; the second time is the data write end time of the X rows of display units which are arranged consecutively and connected to the first shift register ScnaN of a same stage; and the third time is the switching time of the second signal S2.

In embodiment of the present disclosure, the display panel may use the display drive circuit in above-mentioned embodiments. The display drive circuit may realize a particular time sequence signal that satisfies above relational expression (1), such that the pixel circuit may control the light-emitting element to perform image display according to the time sequence signal, which may have three stages of resetting the first node D1, improving current hysteresis characteristics of the M3, and writing the data signal DATA to the first node D1. For the one-drive-multiple drive mode, it may further realize the stage control of compensating the first node D1 by the second node D2 to solve the display brightness difference of odd and even rows, which may realize desirable display effect.

According to above-mentioned embodiments, another embodiment of the present disclosure further provides a display drive method for a display panel. The structure of the display panel refers to above-mentioned embodiments, and the display drive method may not be described in detail in embodiments of the present disclosure.

In embodiments of the present disclosure, the display drive method may include that the first signal, the second signal and the third signal may be provided to the pixel units of each row of display units sequentially through the display drive circuit.

The circuit structure of the display drive circuit and the connection relationship with the display units refer to above-mentioned embodiments, and the display drive method may not be described in detail in embodiments of the present disclosure.

Through different connection relationships between the display drive circuit and the pixel circuits, the one-drive-one drive mode or the one-drive multiple drive mode may be realized.

In embodiment of the present disclosure, the display drive method may use the display drive circuit in above-mentioned embodiments. The display drive circuit may realize a particular time sequence signal that satisfies above relational expression (1), such that the pixel circuit may control the light-emitting element to perform image display according to the time sequence signal, which may have three stages of resetting the first node D1, improving current hysteresis characteristics of the M3, and writing the data signal DATA to the first node D1. For the one-drive-multiple drive mode, it may further realize the stage control of compensating the first node D1 by the second node D2 to solve the display brightness difference of odd and even rows, which may realize desirable display effect.

From above-mentioned embodiments, it may be seen that the display panel, the display drive circuit, and the display drive method provided by the present disclosure may achieve at least following beneficial effects.

In the display panel, the display drive circuit, and the display drive method provided in embodiments of the present disclosure, the first shift registers of first A stages in the display drive circuit may be configured as virtual shift registers; and A is configured to satisfy $$A = \frac{t}{t_0 * X}$$

to form a particular drive time sequence, which may improve the characteristics of the drive transistors, solve the display problem caused by the tailing problem of the output signals of the first shift registers, and improve image display quality.

Various embodiments in the present disclosure may be described in a progressive manner, a parallel manner, or a combination of progressive and parallel manners. Each embodiment may focus on the differences from other embodiments; and same and similar parts between various embodiments may be referred to each other. Since the display panel and the display drive method disclosed in embodiments correspond to the display drive circuit disclosed in embodiments, the description may be relatively simple, and relevant part may be referred to the description of the display drive circuit.

It should be noted that, in the description of the present disclosure, the description of the drawings and embodiments are illustrative rather than restrictive. Same drawing numbers may identify same structures throughout embodiments of the present disclosure. Additionally, the thicknesses of certain layers, films, panels, regions and the like may be exaggerated in the drawings for understanding and ease of description. It should also be understood that when an element such as a layer, film, region or substrate is referred to as being "on" another element, the element may be directly on the other elements, or intermediate elements may be present. In addition, "on" may refer to positioning an element on or below another element but may not essentially refer to positioning the element on an upper side of another element according to the direction of gravity.

The orientation or positional relationship indicated by the terms "upper", "lower", "top", "bottom", "inner", "outer" and the like may be based on the orientation or positional relationship shown the drawings. The orientation or positional relationship may only for the convenience of describing the present disclosure and simplifying the description, rather than indicate or imply that the device or element referred to must have a particular orientation and be constructed and operated in a particular orientation; and therefore, the orientation or positional relationship should not be understood as the limitation of the present disclosure. When a component is considered to be "connected" to another component, it may be directly connected to the other component or there may be an intermediate component between the component and the other component.

It should also be noted that in the present disclosure, relational terms such as first and second may be used only to distinguish one entity or operation from another and may not necessarily require or imply that such actual relationship or order is between those entities or operations.

Moreover, the terms "comprise", "contain" or any other variation thereof are intended to encompass a non-exclusive inclusion, such that an article or equipment comprising a list of elements may not only include those elements, but also other elements not expressly listed, or also include elements inherent to the article or equipment. Without further limitation, an element defined by the phrase "comprising a . . . " may not preclude the presence of additional identical elements in an article or device that includes above-mentioned element.

Above description of disclosed embodiments may enable those skilled in the art to make or use the present disclosure. Various modifications to these embodiments may be readily apparent to those skilled in the art, and generic principles defined herein may be implemented in other embodiments without departing from the spirit or scope of the present disclosure. Therefore, the present disclosure may not be limited according to embodiments in the present disclosure but may be consistent with the widest scope of the principles and novelty features disclosed in the present disclosure.

What is claimed is:

1. A display drive circuit of a display panel, wherein the display panel includes display units arranged in an array; a display unit includes a light-emitting element and a pixel circuit connected to the light-emitting element; and the pixel circuit includes:

a drive transistor, wherein a gate electrode of the drive transistor is connected to a first node, a first electrode of the drive transistor is connected to a second node, and a second electrode of the drive transistor is connected to a third node;

a first reset transistor, wherein a gate electrode of the first reset transistor is configured to input a first signal, a first electrode of the first reset transistor is configured to input a reference voltage, and a second electrode of the first reset transistor is connected to the first node;

a compensation transistor, wherein a gate electrode of the compensation transistor is configured to input a second signal, a first electrode of the compensation transistor is connected to the first node, and the second electrode of the compensation transistor is connected to the third node; and a data write transistor, wherein a gate electrode of the data write transistor is configured to input a third signal, and a first electrode of the data write transistor is configured to input a data signal, wherein the first signal and the second signal have a same period; and the display drive circuit comprising:

first shift registers from a first shift register of a 1st-stage to a first shift register of an Nth-stage, wherein N is a positive integer greater than 1, wherein first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal; wherein:

$$t = a + b + c + d;\ A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; $t_0$ is a horizontal period; and $t_0>0$; wherein X>1, the first shift register of each stage in the first shift registers of the last (N-A) stages is correspondingly connected to X rows of display units which are consecutively arranged; b is a number of the horizontal period occupied by a data write time length of the X rows of display units which are arranged consecutively and connected to a first shift register of a same stage; c is a delay of a third time relative to a second time; the second time is an end time of the number of the horizontal period occupied by the data write time length of the X rows of display units which are arranged consecutively and connected to the first shift register of the same stage; and the third time is a switch switching time of the second signal.

2. The display drive circuit according to claim 1, wherein:

$$a = 0.$$

3. The display drive circuit according to claim 2, wherein: when $$X > 1,\ \frac{b}{t_0} + \frac{c}{t_0} + \frac{d}{t_0} = 3X \text{ and } A = 3.$$

4. The display drive circuit according to claim 1, wherein:

$$b = c, \text{ and/or } c = d.$$

5. The display drive circuit according to claim 1, wherein:

$$c \geq 2t_0.$$

6. The display drive circuit according to claim 5, wherein:

$$c = 2t_0.$$

7. The display drive circuit according to claim 1, wherein: when d>0, for a same row of display units, the display drive circuit is configured to turn on the first reset transistor to reset a voltage of the first node when the first signal is turned on and the second signal is turned off; configured to turn on the first reset transistor and the compensation transistor simultaneously when the first signal and the second signal are turned on simultaneously, such that the drive transistor is in conduction to reset a voltage of the second node; and configured to turn on the third signal after a switch switching time of the first signal is delayed by at least the time length d and is within a time segment when the second signal is maintained to be turned on; wherein:

inputted third signals of different rows of display units are not overlapped with each other.

8. The display drive circuit according to claim 1, further including:

a scan circuit, including a first scan circuit and a second scan circuit, wherein:

the first scan circuit includes cascaded multi-stage first shift registers; the first shift registers are configured to provide the first signal or the second signal to display units connected to the first shift registers; in first shift registers of two adjacent stages, an output signal of a first shift register of a previous stage is configured as an input signal of a first shift register of a next stage; and output signals of the first shift register of the previous stage and the first shift register of the next stage have a turn-on delay of a first time length, wherein the first time length is equal to b; and the second scan circuit includes cascaded multi-stage second shift registers; the second shift registers are configured to provide the third signal to display units connected to the second shift registers; in second shift registers of two adjacent stages, an output signal of a second shift register of a previous stage is configured as an input signal of a second shift register of a next stage; and output signals of the second shift register of the previous stage and the second shift register of the next stage have a turn-on delay.

9. The display drive circuit according to claim 8, wherein:

the display panel includes M rows of display units; the M rows of display units are equally divided into a plurality of display unit groups along a column direction of the array; a display unit group of the plurality of display unit groups includes a plurality of rows of display units arranged consecutively along the column direction; and M is a positive integer greater than 1; and the first scan circuit is configured to make pixel circuits, connected to a same group of display units, to input a same first signal and a same second signal; in two adjacent display unit groups, a delay time length of the first signal inputted by a next display unit group relative to the first signal inputted by a previous display unit group is b; wherein:

for a same row of display units, a delay time length of the second signal inputted relative to the first signal inputted is not less than 3b.

10. The display drive circuit according to claim 9, wherein:

along the column direction, the display panel includes display unit groups from a 1st display unit group to an mth display unit group, wherein m is a positive integer less than M, M is an integer multiple of m, and N=m+A;

the first scan circuit includes first shift registers from the first shift register of the 1st-stage to a first shift register of an (m+A)th-stage;

a gate electrode of the first reset transistor in a jth display unit group is connected to an output terminal of a first shift register of a jth-stage to input the first signal, wherein j is a positive integer not greater than m; and a gate electrode of the compensation transistor in the jth display unit group is connected to an output terminal of a first shift register of an (A+j)th-stage to be inputted the second signal.

11. The display drive circuit according to claim 1, wherein:

$$X = 2 \text{ or } 3 \text{ or } 4.$$

12. The display drive circuit according to claim 8, wherein:

the first shift register includes a pull-down output module configured to control the first shift register outputs a low level according to a time sequence, wherein a storage unit is connected to a control terminal of the pull-down output module, and the storage unit makes d>0.

13. The display drive circuit according to claim 12, wherein the first stage shift register includes:

an input module, configured to output a fourth signal according to an input signal;

a pull-down control module, configured to control a potential of a first connection point according to a first clock signal, a high level, a low level, the fourth signal, and a second clock signal;

a pull-up control module, configured to control a potential of a second connection point according to the first clock signal, the second clock signal, the high level, and the fourth signal;

a pull-down output module, configured to control an output terminal of the first shift register to output the low level according to the potential of the first connection point and the low level; and a pull-up output module, configured to control the output terminal of the first shift register to output the high level according to the potential of the second connection point and the high level.

14. The display drive circuit according to claim 13, wherein:

the pull-up output module includes:

a first switch transistor, wherein a gate electrode of the first switch transistor is connected to the second connection point, a first electrode of the first switch transistor is configured to input the high level, and a second electrode of the first switch transistor is connected to the output terminal of the first shift register; and a first capacitor, connected between the gate electrode of the first switch transistor and the first electrode of the first switch transistor; and the pull-down output module includes:

a second switch transistor, wherein a gate electrode of the second switch transistor is connected to the first connection point, a first electrode of the second switch transistor is connected to the output terminal of the first shift register, and a second electrode of the second switch transistor is configured to input the low level; and a second capacitor, wherein one electrode plate of the second capacitor is connected to the first connection point, and the other electrode plate of the second capacitor is configured to input the first clock signal, wherein the second capacitor is a storage unit, and the gate electrode of the second switch transistor is a control terminal of the pull-down output module.

15. The display drive circuit according to claim 13, wherein:

the pull-up control module include:

a third switch transistor, wherein a gate electrode of the third switch transistor is connected to the first connection point, a first electrode of the third switch transistor is configured to input the high level, and a second electrode of the third switch transistor is connected to the second connection point;

a fourth switch transistor, wherein a gate electrode of the fourth switch transistor is configured to input the first clock signal, a first electrode of the fourth switch transistor is connected to a third connection point, and a second electrode of the fourth switch transistor is connected to the second connection point;

a fifth switch transistor, wherein a gate electrode of the fifth switch transistor is connected to a fourth connection point, a first electrode of the fifth switch transistor is connected to the third connection point, a second electrode of the fifth switch transistor is configured to input the first clock signal, and a third capacitor is connected between the third connection point and the fourth connection point; and a sixth switch transistor, wherein a gate electrode of the sixth switch transistor is configured to input the fourth signal, a first electrode of the sixth switch transistor is connected to the fourth connection point, and a second electrode of the sixth switch transistor is configured to input the second clock signal;

the pull-down control module includes:

a seventh switch transistor, wherein a gate electrode of the seventh switch transistor is connected to a fourth connection point, a first electrode of the seventh switch transistor is configured to input the high level, and a second electrode of the seventh switch transistor is connected to a fifth connection point;

an eighth transistor, wherein a gate electrode of the eighth transistor is configured to input the first clock signal, a first electrode of the eighth transistor is connected to the fifth connection point, and a second electrode of the eighth transistor is configured to input the fourth signal; and a ninth switch transistor, wherein a gate electrode of the ninth switch transistor is configured to input the second clock signal, a first electrode of the ninth switch transistor is connected to the fourth connection point, and a second electrode of the ninth switch transistor is configured to input the low level; and the input module includes a tenth switch transistor, wherein a gate electrode of the tenth switch transistor is configured to input the second clock signal, a first electrode of the tenth switch transistor is configured to output the fourth signal, and a second electrode of the tenth switch transistor is configured to input the input signal.

16. The display drive circuit according to claim 8, wherein:

the display panel includes M rows of display units, wherein M is a positive integer greater than 1;

the second scan circuit includes second shift registers from a second shift register of a 1st-stage to a second shift register of an Mth-stage; and an output terminal of a second shift register of an ith-stage is connected to the gate electrode of the data write transistor in a display unit of an ith row.

17. A display drive circuit of a display panel, wherein the display panel includes display units arranged in an array; a display unit includes a light-emitting element and a pixel circuit connected to the light-emitting element; and the pixel circuit includes:

a drive transistor, wherein a gate electrode of the drive transistor is connected to a first node, a first electrode of the drive transistor is connected to a second node, and a second electrode of the drive transistor is connected to a third node;

a first reset transistor, wherein a gate electrode of the first reset transistor is configured to input a first signal, a first electrode of the first reset transistor is configured to input a reference voltage, and a second electrode of the first reset transistor is connected to the first node;

a compensation transistor, wherein a gate electrode of the compensation transistor is configured to input a second signal, a first electrode of the compensation transistor is connected to the first node, and the second electrode of the compensation transistor is connected to the third node; and a data write transistor, wherein a gate electrode of the data write transistor is configured to input a third signal, and a first electrode of the data write transistor is configured to input a data signal, wherein the first signal and the second signal have a same period; and the display drive circuit comprising:

first shift registers from a first shift register of a 1st-stage to a first shift register of an Nth-stage, wherein N is a positive integer greater than 1, wherein first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal; wherein:

$$t = a + b + c + d;\ A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; $t_0$ is a horizontal period; and $t_0>0$; wherein X=1, the first shift register of each stage in the first shift registers of the last (N-A) stages is connected to one row of display units; b is a number of the horizontal period occupied by a data write time length of the one row of display units; c is a constant 0.

18. The display drive circuit according to claim 17, wherein:

$$a = 0.$$

19. The display drive circuit according to claim 18, wherein:

when $$X = 1,\ c = 0,\ \frac{b}{t_0} + \frac{d}{t_0} = 2X \text{ and } A = 2.$$

20. A display panel, comprising:

display units, wherein a display unit includes a light-emitting element and a pixel circuit connected to the light-emitting element; and the pixel circuit includes:

a drive transistor, wherein a gate electrode of the drive transistor is connected to a first node, a first electrode of the drive transistor is connected to a second node, and a second electrode of the drive transistor is connected to a third node;

a first reset transistor, wherein a gate electrode of the first reset transistor is configured to input a first signal, a first electrode of the first reset transistor is configured to input a reference voltage, and a second electrode of the first reset transistor is connected to the first node;

a compensation transistor, wherein a gate electrode of the compensation transistor is configured to input a second signal, a first electrode of the compensation transistor is connected to the first node, and the second electrode of the compensation transistor is connected to the third node; and a data write transistor, wherein a gate electrode of the data write transistor is configured to input a third signal, and a first electrode of the data write transistor is configured to input a data signal, wherein the first signal and the second signal have a same period; and a display drive circuit comprising:

first shift registers from a first shift register of a 1st-stage to a first shift register of an Nth-stage, wherein N is a positive integer greater than 1, wherein first shift registers of first A stages are virtual shift registers which are at least configured to make that the inputted second signal of a same pixel circuit has a delay of a set time length t relative to the first signal; A is a positive integer greater than 1; and first shift registers of last (N-A) stages are at least configured to provide pixel circuits with the second signal; wherein:

$$t = a + b + c + d;\ A = \frac{t}{t_0 * X};$$

a is a rounded-down value of a time length between a turn-on time of the third signal and a first time; the first time is a time when the first signal is turned off; d is a switching time length of the second signal; X is a row number of display units connected to a first shift register of each stage in the first shift registers of the last (N-A) stages; $t_0$ is a horizontal period; and $t_0>0$; wherein X>1, the first shift register of each stage in the first shift registers of the last (N-A) stages is correspondingly connected to X rows of display units which are consecutively arranged; b is a number of the horizontal period occupied by a data write time length of the X rows of display units which are arranged consecutively and connected to a first shift register of a same stage; c is a delay of a third time relative to a second time; the second time is an end time of the number of the horizontal period occupied by the data write time length of the X rows of display units which are arranged consecutively and connected to the first shift register of the same stage; and the third time is a switch switching time of the second signal.

* * * * *